(12) United States Patent  (10) Patent No.: US 7,923,812 B2
Scheuerlein  (45) Date of Patent: Apr. 12, 2011

(54) QUAD MEMORY CELL AND METHOD OF MAKING SAME

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 334 days.

(21) Appl. No.: 12/318,001

(22) Filed: Dec. 19, 2008

(65) Prior Publication Data

US 2010/0155689 A1    Jun. 24, 2010

(51) Int. Cl.
*H01L 23/525* (2006.01)

(52) U.S. Cl. ............... 257/529; 257/530; 257/E23.146; 257/E23.147; 365/69; 365/148; 365/72

(58) Field of Classification Search .............. 257/529, 257/530, E23.146, E23.147; 365/69, 72, 365/148
See application file for complete search history.

(56) References Cited

U.S. PATENT DOCUMENTS

| | | | |
|---|---|---|---|
| 3,569,945 | A | 3/1971 | Ho |
| 3,693,173 | A | 9/1972 | Heightley et al. |
| 4,646,266 | A | 2/1987 | Ovshinsky et al. |
| 5,751,012 | A | 5/1998 | Wolstenholme et al. |
| 5,835,396 | A | 11/1998 | Zhang |
| 6,034,882 | A | 3/2000 | Johnson et al. |
| 6,055,180 | A | 4/2000 | Gudesen et al. |
| 6,185,122 | B1 | 2/2001 | Johnson et al. |
| 6,420,215 | B1 | 7/2002 | Knall et al. |
| 6,579,760 | B1 | 6/2003 | Lung |
| 6,618,295 | B2 | 9/2003 | Scheuerlein |
| 6,753,561 | B1 | 6/2004 | Rinerson et al. |
| 6,912,153 | B2 | 6/2005 | Tihanyi |
| 7,035,141 | B1 | 4/2006 | Tripsas et al. |
| 7,283,383 | B2 | 10/2007 | Kang |
| 7,495,947 | B2 * | 2/2009 | Scheuerlein et al. ......... 365/148 |
| 7,733,685 | B2 * | 6/2010 | Scheuerlein et al. ......... 365/148 |
| 2004/0160819 | A1 | 8/2004 | Rinerson et al. |
| 2005/0180203 | A1 | 8/2005 | Lin et al. |
| 2005/0269553 | A1 | 12/2005 | Sen et al. |
| 2006/0002173 | A1 | 1/2006 | Parkinson et al. |
| 2006/0006463 | A1 | 1/2006 | Islam et al. |
| 2008/0175032 | A1 * | 7/2008 | Tanaka et al. .................... 365/51 |
| 2009/0067229 | A1 | 3/2009 | Kang et al. |
| 2009/0180309 | A1 | 7/2009 | Liu |
| 2010/0008123 | A1 * | 1/2010 | Scheuerlein .................. 365/148 |
| 2010/0012912 | A1 * | 1/2010 | Schricker .......................... 257/2 |

FOREIGN PATENT DOCUMENTS

EP    1 426 966 A2    6/2004
(Continued)

OTHER PUBLICATIONS

U.S. Appl. No. 09/560,626, filed Apr. 28, 2000, Knall.
(Continued)

*Primary Examiner* — Victor Mandala
(74) *Attorney, Agent, or Firm* — The Marbury Law Group PLLC

(57) ABSTRACT

A non-volatile memory device includes a first electrode, a diode steering element, at least three resistivity switching storage elements, and a second electrode. The diode steering element electrically contacts the first electrode and the at least three resistivity switching storage elements. The second electrode electrically contacts only one of the at least three resistivity switching storage elements.

28 Claims, 18 Drawing Sheets

FOREIGN PATENT DOCUMENTS

| | | | |
|---|---|---|---|
| EP | 1 659 593 | A2 | 5/2006 |
| EP | 1 892 722 | A1 | 2/2008 |
| WO | WO 03/085675 | A2 | 10/2003 |
| WO | WO 2008/062688 | A1 | 5/2008 |
| WO | WO 2008/140979 | A1 | 11/2008 |
| WO | WO 2008/157049 | A1 | 12/2008 |

OTHER PUBLICATIONS

U.S. Appl. No. 09/638,428, filed Aug. 14, 2000, Johnson.
U.S. Appl. No. 09/897,705, filed Jun. 29, 2001, Kleveland.
U.S. Appl. No. 10/185,508, filed Jun. 27, 2002, Cleeves.
U.S. Appl. No. 11/287,452, filed Nov. 23, 2005, Herner.
U.S. Appl. No. 12/216,677, filed Jul. 9, 2008, Scheuerlein.
U.S. Appl. No. 12/216,678, filed Jul. 9, 2008, Scheuerlein.
U.S. Appl. No. 12/318,022, filed Dec. 19, 2008, Scheuerlein.
Peter K. Naji et al., "A 256kb 3.0V 1T1MTJ Nonvolatile Magnetoresistive RAM", Digest of Technical Papers of the 2001 IEEE International Solid-State Circuits Conference, ISSCC 2001/Session 7/Technology Directions: Advanced Technologies/7.6, Feb. 6, 2001, 3 pgs.
Notice of Allowance received in U.S. Appl. No. 12/216,678 dated Mar. 1, 2010.
International Search Report and Written Opinion received in PCT/US2009/049502 dated Aug. 28, 2009.
International Search Report received in PCT/US2009/068234 dated Mar. 19, 2010.
International Search Report and Written Opinion received in PCT/US2009/049513 dated Aug. 21, 2009.
International Search Report and Written Opinion, Intl. Application PCT/US09/68234. Jul. 2, 2010, International Search Authority/European Patent Office.

* cited by examiner

| Selected cell R | Effective sneak path R | Measured current | Force cell to Ron Reread | Force cell to Roff Reread |
|---|---|---|---|---|
| Ron | Ron | 2 Ion | 2 Ion | Ion |
| Roff | Ron | ~Ion | 2 Ion | ~Ion |
| Ron | Roff | ~Ion | ~Ion | 2 Ioff |
| Roff | Roff | 2 Ioff | ~Ion | 2 Ioff |

QUAD MEMORY CELL AND METHOD OF MAKING SAME

BACKGROUND

The present invention relates generally to the field of memory devices and more specifically to the field of nonvolatile memory devices containing diode steering elements.

Three dimensional memories have memory cells located at numerous levels above a substrate. Each level includes a plurality of parallel first lines, such as word lines, extending in one direction. The first lines are vertically separated from a plurality of parallel second lines, such as bit lines, extending in a second direction. The first lines may extend perpendicular to the first lines. Cells are located between the first lines and second lines at the intersections of these lines. These memories are described, for example, in U.S. Pat. Nos. 5,835,396 and 6,034,882.

Another way of fabricating three-dimensional memory arrays uses "rail-stacks" as described in U.S. Pat. No. 6,420,215 and in U.S. patent application Ser. No. 09/560,626 by N. Johan Knall, filed Apr. 28, 2000, which describes a memory employing antifuses where a diode is formed upon programming a particular bit. Previous designs consist of rail stacks crossing one another.

SUMMARY

In a representative embodiment, a non-volatile memory device includes a first electrode, a diode steering element, at least three resistivity switching storage elements, and a second electrode. The diode steering element electrically contacts the first electrode and the at least three resistivity switching storage elements. The second electrode electrically contacts only one of the at least three resistivity switching storage elements.

In another embodiment, a non-volatile memory device includes a first electrode, a first diode steering element, at least three resistivity switching storage elements, a second diode steering element, and a second electrode. The first diode steering element electrically contacts the first electrode and the at least three resistivity switching storage elements. The second diode steering element electrically contacts the second electrode and only one of the at least three resistivity switching storage elements.

In another embodiment, a non-volatile memory device includes a first diode steering element, a first bit line electrically contacting the first diode steering element, at least three resistivity switching storage elements, a first word line, a second diode steering element, a second bit line, at least three additional resistivity switching storage elements, and a by-pass bit line. The first diode steering element electrically contacts the at least three resistivity switching storage elements, and the first word line electrically contacts only one of the at least three resistivity switching storage elements. The second diode steering element is located adjacent to the first diode steering element. The second bit line electrically contacts the second diode steering element. The second diode steering element electrically contacts the at least three additional resistivity switching storage elements, and the first word line electrically contacts only one of the at least three additional resistivity switching storage elements. The by-pass bit line is located between the first and the second bit lines, but the by-pass bit line does not electrically contact the first diode steering element or the second diode steering element.

In another embodiment, a memory array includes a matrix of first diode steering cells arranged in a plurality of rows and a plurality of columns on a first layer of the memory array, and a plurality of X lines. The X lines are not substantially parallel to the rows. Each of the first diode steering cells contacts at least one of the plurality of X lines. A number of X lines of the plurality of the X lines is greater than a number of columns of the plurality of columns.

In a representative embodiment, a method of making a semiconductor device includes forming a conductor layer, forming a resistivity switching storage element layer over the conductor layer, and forming at least one first layer of a diode steering element over the resistivity switching storage element layer. The conductor layer, the resistivity switching storage element layer and the at least one first layer are patterned using a first mask to form a plurality of patterns. Each pattern comprises a portion of the conductor layer, a portion of the resistivity switching storage element layer and a portion of the at least one first layer. Spaces between adjacent patterns are filled with a gap fill insulating material. At least one second layer of the diode steering element is formed over the patterns and over the gap fill insulating material such that the at least one second layer contacts portions of the at least one first layer in the plurality patterns. The at least one second layer, the portions of the at least one first layer, and portions of the resistivity switching storage element layer are patterned using a second mask to form a plurality of diodes. Each diode includes one portion of the second layer, at least three portions of the first layer separated from each other by the gap fill insulating layer and at least three resistivity switching storage elements separated from each other by the gap fill insulating layer. Each of the at least three portions of the first layer contacts one of the at least three resistivity switching storage elements.

In another embodiment, a method of making a semiconductor device includes forming at least one first layer of a diode and forming at least one second layer of a diode over the first layer. The at least one first layer and the at least one second layer are patterned into a plurality of diodes using a first mask. Spaces between the plurality of diodes are filled with a gap fill insulating material. A resistivity switching storage element layer is formed over the plurality of diodes and over the gap fill insulating material. A conductor layer is formed over the resistivity switching storage element layer. The conductor layer, the resistivity switching storage element layer and the at least one second layer are patterned using a second mask such that each of the plurality of diodes comprises one portion of the first layer, at least three portions of the second layer which are separated from each other, and at least three resistivity switching storage elements which are separated from each other. Each of the at least three portions of the second layer contacts one of the at least three resistivity switching storage elements.

In another embodiment, a method of making a semiconductor device includes forming a first layer of a diode in electrical contact with a first electrode. An insulating layer is formed over the first layer. A tapered opening layer is formed in the insulating layer to expose the first layer. At least one second layer of the diode layer is formed in the tapered opening to form the diode such that the at least one second layer has a tapered shape.

In another embodiment, a method of reading a nonvolatile memory device includes sensing a selected cell a first time. A first reading is taken. The selected cell is forced to a first state. The selected cell is sensed a second time. A second reading is taken. The first reading is compared to the second reading. The cell is a diode and a resistivity switching storage element, or a diode, a resistivity switching storage element, and a second diode. The cell is part of an array of cells, and the state of the selected cell is determined based on comparing the first reading and the second reading.

DETAILED DESCRIPTION

A structure and method for fabricating a memory cell, such as a quad or tri-memory cell, for three dimensional and two dimensional memory arrays are described. In the following description, for purposes of explanation, numerous specific details are set forth to provide a thorough understanding of exemplary embodiments of the invention. It will be evident, however, to one skilled in the art that the invention may be practiced without these specific details. The terms word line, bit line, x-line and y-line are used interchangeably. The drawings are not to scale. In other instances, well-known structures and devices are shown in simplified form to facilitate description of the exemplary embodiments. In a representative embodiment, a 45 nm lithography process is used; however, a 22 nm, 65 nm, or any other lithography process can be used.

The term "diode", as used herein, includes a diode which is partially shared between three or more memory cells. Consequently, the term "diode" also includes structures where portions of the diode are electrically connected to a common ohmic contact while other potions of the diode are electrically connected to multiple, distinct ohmic contacts. Hence, the term diode can include operationally distinct diode paths in a single structure.

See U.S. patent application Ser. No. 12/216,677 titled "MULTIPLE SERIES PASSIVE ELEMENT MATRIX CELL FOR THREE-DIMENSIONAL ARRAYS" filed on Jul. 9, 2008 and U.S. patent application Ser. No. 12/216,678 titled "CROSS POINT MEMORY CELL WITH DISTRIBUTED DIODES AND METHOD OF MAKING SAME" filed on Jul. 9, 2008 which are incorporated herein by reference for a description of memory cells containing plural diodes per cell.

Circuit of a Quad Cell

Figure 1:
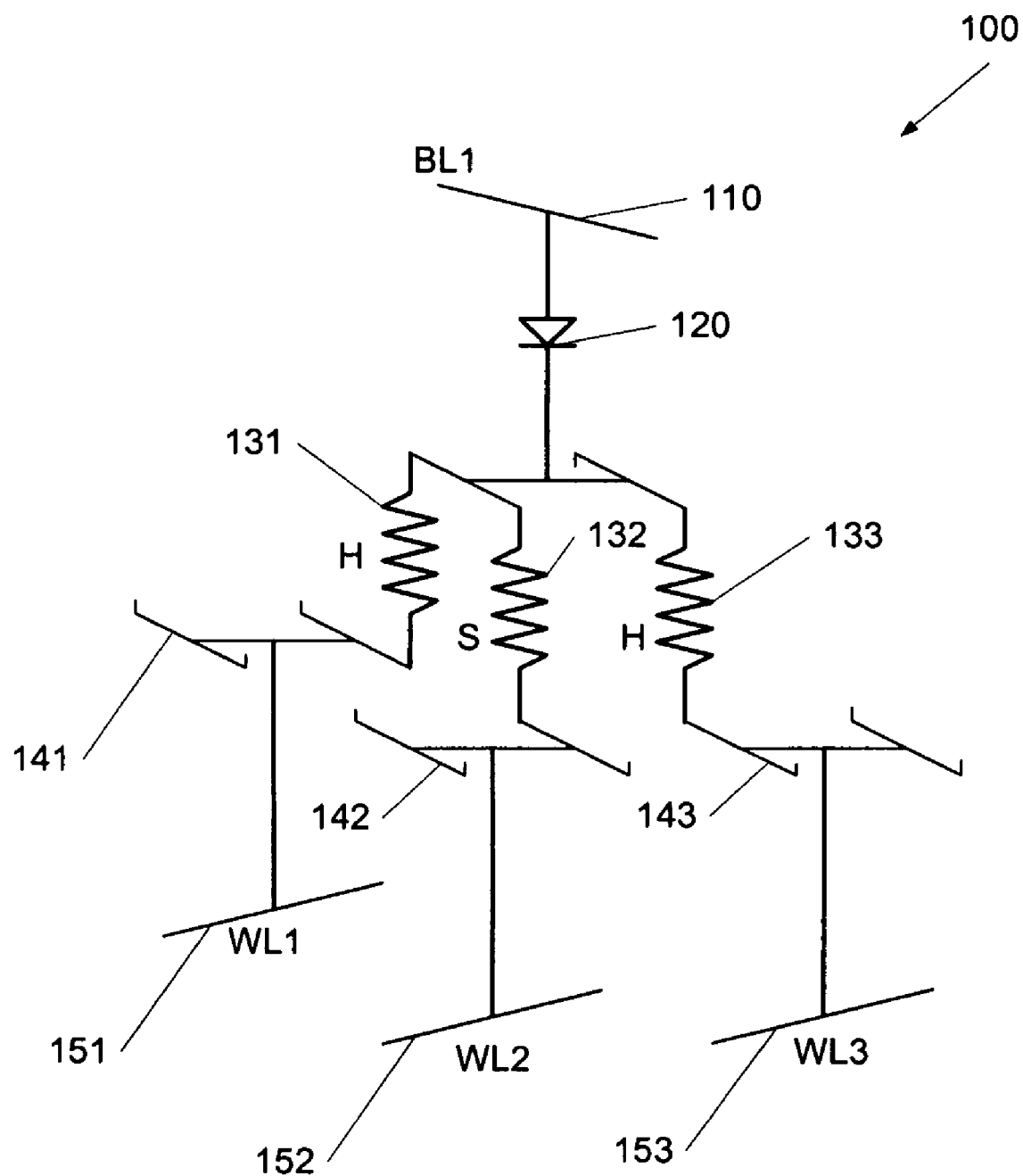
FIG. 1 is a schematic of a one diode quad memory cell in accordance with a representative embodiment.

Referring to FIG. 1, a schematic of a one diode quad memory cell 100 in accordance with a representative embodiment is shown. The one diode quad memory cell 100 includes a X line 110 (a first electrode or bit line "BL1"), a first diode steering element 120, a first resistivity switching storage element 131, a second resistivity switching storage element 132, a third resistivity switching storage element 133, a fourth resistivity switching storage element (not shown for clarity), a first contact 141, a second contact 142, a third contact 143, a fourth contact (not shown for clarity), a first Y line 151 (a second electrode or word line "W1"), a second Y line 152 (word line "W2"), a third Y line 153 (word line "W3"), and a fourth Y line (not shown for clarity). The positions of the X lines and Y lines may be reversed if desired. Alternatively, a one diode tri memory cell includes one X line, three resistivity switching storage elements, three contacts, and three Y lines.

The X line 110, the first Y line 151, the second Y line 152, the third Y line 153, and the fourth Y line (not shown) are made of one or more layers of conductive material, such as copper, aluminum, titanium, tungsten, alloys thereof, titanium nitride, etc. The X line 110, the first Y line 151, the second Y line 152, the third Y line 153, and the fourth Y line (not shown) are connected to driving circuitry (also referred to as driver circuits, not shown for clarity) located below, above or to the side of the memory cells. The driving circuitry biases the first diode steering element 120 and also includes circuitry for reading and writing to the one diode quad memory cell 100.

The first diode steering element 120 can be any suitable diode, such as a semiconductor diode. Examples of a semiconductor diode include p-n and p-i-n semiconductor diodes formed in single crystal, polycrystalline or amorphous semiconductor material, such as silicon, germanium, silicon-germanium or compound semiconductors, such as Group III-V or II-VI semiconductors. Alternatively, the first diode steering element 120 can be a metal insulator metal (MIM) diode, a metal insulator-insulator metal (MIIM) diode, tunneling diodes, or any two terminal non-linear conducting device.

The first resistivity switching storage element 131, the second resistivity switching storage element 132, the third resistivity switching storage element 133, and the fourth resistivity switching storage element (not shown) are preferably a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

The first diode steering element 120 is electrically connected to the X line 110. The first diode steering element 120 is shared by the first resistivity switching storage element 131, the second resistivity switching storage element 132, the third resistivity switching storage element 133, and the fourth resistivity switching storage element (not shown). Hence, the effective diode area of the first diode steering element 120 is large relative to the contact area of the resistivity switching storage elements, allowing more current to pass through the contact area than if the diode and the resistivity switching storage elements had the same area. Alternatively, the first diode steering element 120 can be shared by three or more resistivity switching storage elements.

The first contact 141, the second contact 142, the third contact 143, and fourth contact (not shown) are made of one or more layers of conductive material, such as copper, aluminum, titanium, tungsten, alloys thereof, titanium nitride, etc. The first contact 141, the second contact 142, the third contact 143, and fourth contact (not shown) are electrically connected to the first Y line 151, the second Y line 152, the third Y line 153, and the fourth Y line (not shown), respectively. The first contact 141, the second contact 142, the third contact 143, and fourth contact (not shown) can also be part of the first Y line 151, the second Y line 152, the third Y line 153, and the fourth Y line (not shown), respectively.

The first contact 141 is shared with the first resistivity switching storage element 131, and at least two other resistivity switching storage elements (not shown). The second contact 142 is shared with the second resistivity switching storage element 132, and at least two other resistivity switching storage elements (not shown). The third contact 143 is shared with the third resistivity switching storage element 133, and at least two other resistivity switching storage elements (not shown). The fourth contact (not shown) is shared with the fourth resistivity switching storage element (not shown), and at least two other resistivity switching storage elements (not shown).

Hence, when the first diode steering element 120 is biased by the X line 110 and one of the Y lines, current is allowed to flow only through the respective resistivity switching storage element. Notably, current does not flow through the other resistivity switching storage elements. Advantageously, the diode area of the first diode steering element 120 is much larger than the contact area of an individual resistivity switching storage element. Consequently, a stronger current can be applied to a resistivity switching storage element than would be possible if the diode area was the same as the area of the memory layer.

In FIG. 1, the memory cell "S" containing the second resistivity switching storage element 132 is activated (as denoted by "S" for selected) by biasing the first diode steering element 120 by applying a voltage between the X line 110 and the second Y line 152. Additionally, the first resistivity switching storage element 131, the third resistivity switching storage element 133, and the fourth resistivity switching storage element (not shown) are half selected (as denoted by "H") by the biasing of the first diode steering element 120. Hence, current will only flow through the memory cell "S" containing second resistivity switching storage element 132 and not through the other memory cells "H," for instance, the first resistivity switching storage element 131, the third resistivity switching storage element 133, and the fourth resistivity switching storage element (not shown). Thus, a unique current path exists through each selected memory cell (such as cell "S") between each bit line (such as the X line 110) and each word line (such as the second Y line 152). A preferred biasing of array lines in one embodiment comprises a highest bias Vpp on the selected bit line, ground on the selected word line, ground on unselected bit lines and Vpp less an offset voltage on the unselected word lines. In one embodiment the offset voltages for programming the selected memory cell are about the diode turn on voltage, and the offset voltages for reading the selected memory cell could be significantly less than the diode turn on voltage or even zero volts.

Figure 2:
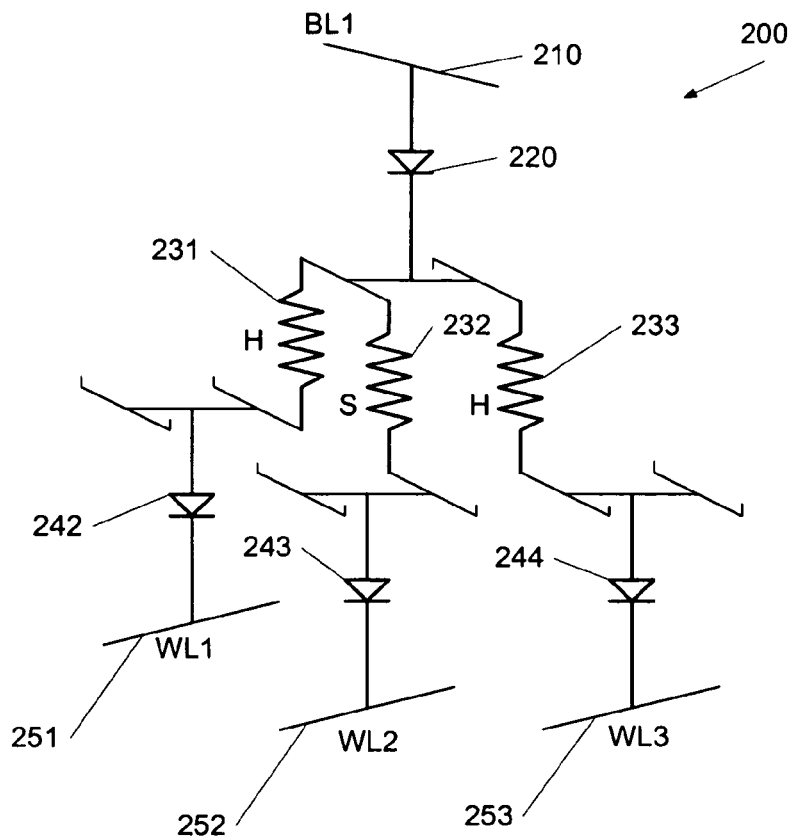
FIG. 2 is a schematic of a two diode quad memory cell in accordance with a representative embodiment.

Referring to FIG. 2, a schematic of a two diode quad memory cell 200 in accordance with a representative embodiment is shown. The two diode quad memory cell 200 includes a X line 210 (a first electrode or bit line "BL1"), a first diode steering element 220, a first resistivity switching storage element 231, a second resistivity switching storage element 232, a third resistivity switching storage element 233, a fourth resistivity switching storage element (not shown for clarity), a second diode steering element 242, a third diode steering element 243, a fourth diode steering element 244, a fifth diode steering element (not shown for clarity), a first Y line 251 (a second electrode or word line "W1"), a second Y line 252 (word line "W2"), a third Y line 253 (word line "W3"), and a fourth Y line (not shown for clarity). The positions of the X lines and Y lines may be reversed if desired. Alternatively, a two diode tri memory cell includes one X line, three resistivity switching storage elements, four diode steering elements, and three Y lines.

The X line 210, the first Y line 251, the second Y line 252, the third Y line 253, and the fourth Y line (not shown) are made of one or more layers of conductive material, such as copper, aluminum, titanium, tungsten, alloys thereof, titanium nitride, etc. The X line 210, the first Y line 251, the second Y line 252, the third Y line 253, and the fourth Y line (not shown) are connected to driving circuitry (also referred to as driver circuits, not shown for clarity) located below, above or to the side of the memory cells. The driving circuitry biases the first diode steering element 220 and, selectively, the second diode steering element 242, the third diode steering element 243, the fourth diode steering element 244, and the fifth diode steering element (not shown). The driving circuitry also includes circuitry for reading and writing to the two diode quad memory cell 200.

The first diode steering element 220, the second diode steering element 242, the third diode steering element 243, the fourth diode steering element 244, and the fifth diode steering element (not shown) can be any suitable diode, such as a semiconductor diode. Examples of a semiconductor diode include p-n and p-i-n semiconductor diodes formed in single crystal, polycrystalline or amorphous semiconductor material, such as silicon, germanium, silicon-germanium or compound semiconductors, such as Group III-V or II-VI semiconductors. Alternatively, the first diode steering element 220, the second diode steering element 242, the third diode steering element 243, the fourth diode steering element 244, and the fifth diode steering element (not shown) can be a metal insulator metal (MIM) diode, a metal insulator-insulator metal (MIIM) diode, tunneling diodes, or any two terminal non-linear conducting device. Likewise, the first diode steering element 220, the second diode steering element 242, the third diode steering element 243, the fourth diode steering element 244, and the fifth diode steering element (not shown) can comprise different types of diodes or be fabricated with different diode properties.

The first resistivity switching storage element 231, the second resistivity switching storage element 232, the third resistivity switching storage element 233, and the fourth resistivity switching storage element (not shown) are preferably a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

The first diode steering element 220 is electrically connected to the X line 210. The first diode steering element 220 is shared by the first resistivity switching storage element 231, the second resistivity switching storage element 232, the third resistivity switching storage element 233, and the fourth resistivity switching storage element (not shown). Hence, the effective diode area of the first diode steering element 220 is large relative to the contact area of the resistivity switching storage elements, allowing more current to pass the contact area than if the diode and the resistivity switching storage elements had the same area. Alternatively, the first diode steering element 220 can be shared by three or more resistivity switching storage elements.

The second diode steering element 242 is shared with the first resistivity switching storage element 231, and at least two other resistivity switching storage elements (not shown). The third diode steering element 243, is shared with the second resistivity switching storage element 232, and at least two other resistivity switching storage elements (not shown). The fourth diode steering element 244, is shared with the third resistivity switching storage element 233, and at least two other resistivity switching storage elements (not shown). The fifth diode steering element (not shown), is shared with the fourth resistivity switching storage element (not shown), and at least two other resistivity switching storage elements (not shown).

Hence, when the first diode steering element 220 and one of the second, third, fourth, or fifth diode steering elements are biased by the X line 210 and one of the Y lines, current is allowed to flow only through the related resistivity switching storage element. Notably, current does not flow through the other resistivity switching storage elements. Advantageously, the combined diode area of the first diode steering element 220 and one of the second, third, fourth, or fifth diode steering elements is much larger than the contact area of an individual resistivity switching storage element. Consequently, a stronger current can be applied to a resistivity switching storage element than would be possible if the diode areas were the same as the area of the resistivity switching storage elements.

In FIG. 2, the memory cell "S" containing the second resistivity switching storage element 232 is activated (as denoted by "S" for selected) by biasing the first diode steering element 220 and the third diode steering element 243 by applying a voltage between the X line 210 and the second Y line 252. Additionally, the first resistivity switching storage element 231, the third resistivity switching storage element 233, and the fourth resistivity switching storage element (not shown) are half selected (as denoted by "H") by the biasing of the first diode steering element 220. Hence, current will only flow through the memory cell "S" containing second resistivity switching storage element 232 and not through the other memory cells "H," for instance, the first resistivity switching storage element 231, the third resistivity switching storage element 233, and the fourth resistivity switching storage element (not shown). Thus, a unique current path exists through each selected memory cell (such as cell "S") between each bit line (such as the X line 210) and each word line (such as the second Y line 252). A preferred biasing of array lines in one embodiment comprises a highest bias Vpp on the selected bit line, ground on the selected word line, ground plus an offset voltage on unselected bit lines and Vpp less an offset voltage on the unselected word lines. In one embodiment the offset voltages for programming the selected memory cell are about the diode turn on voltage (of the effective diode), and the offset voltages for reading the selected memory cell could be significantly less than the diode turn on voltage or even zero volts.

Structure of a One Diode Quad Cell

Figure 3:
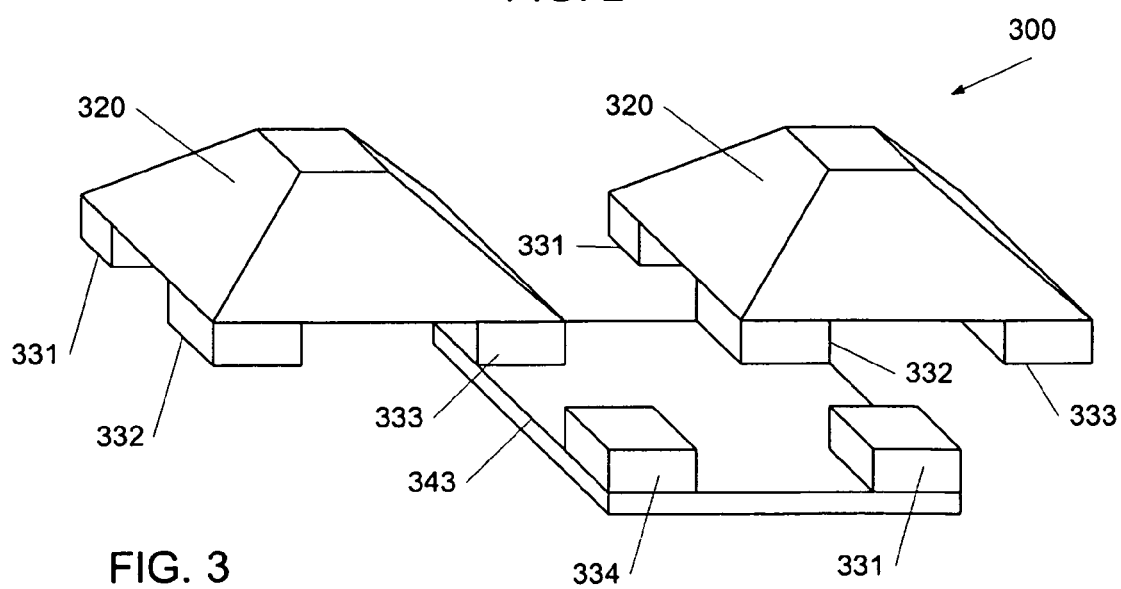
FIG. 3 is a perspective view of one diode quad memory cells in accordance with a representative embodiment.

Referring to FIG. 3, a perspective view of one diode quad memory cells 300 in accordance with a representative embodiment is shown. The one diode quad memory cells 300 each include first diode steering elements 320, which corresponds to the first diode steering element 120 in FIG. 1, four resistivity switching storage elements 331, 332, 333, and 334, which correspond to the resistivity switching storage elements 131, 132, 133, and (not shown) in FIG. 1, and a contact 343, which corresponds to the contacts 141, 142, and 143 in FIG. 1. The first diode steering elements 320 can be tapered (as depicted) or not tapered. The first diode steering elements 320 are electrically connected to four resistivity switching storage elements 331-334. In this example, each first diode steering element is connected to four resistivity switching storage elements; however, three or more resistivity switching storage elements can be connected. Each contact 343 is electrically connected to four resistivity switching storage elements 331-334. In this example, each contact is connected to four resistivity switching storage elements; however, three or more resistivity switching storage elements can be connected. The resistivity switching storage elements 331-334 are located where the first diode steering elements 320 and the contact 343 overlap. Each diode steering element and each contact electrically contact only one common resistivity switching storage element. In FIG. 3, the first diode steering elements 320 are located above the contacts 343; however, their positions can be reversed.

Figure 4:
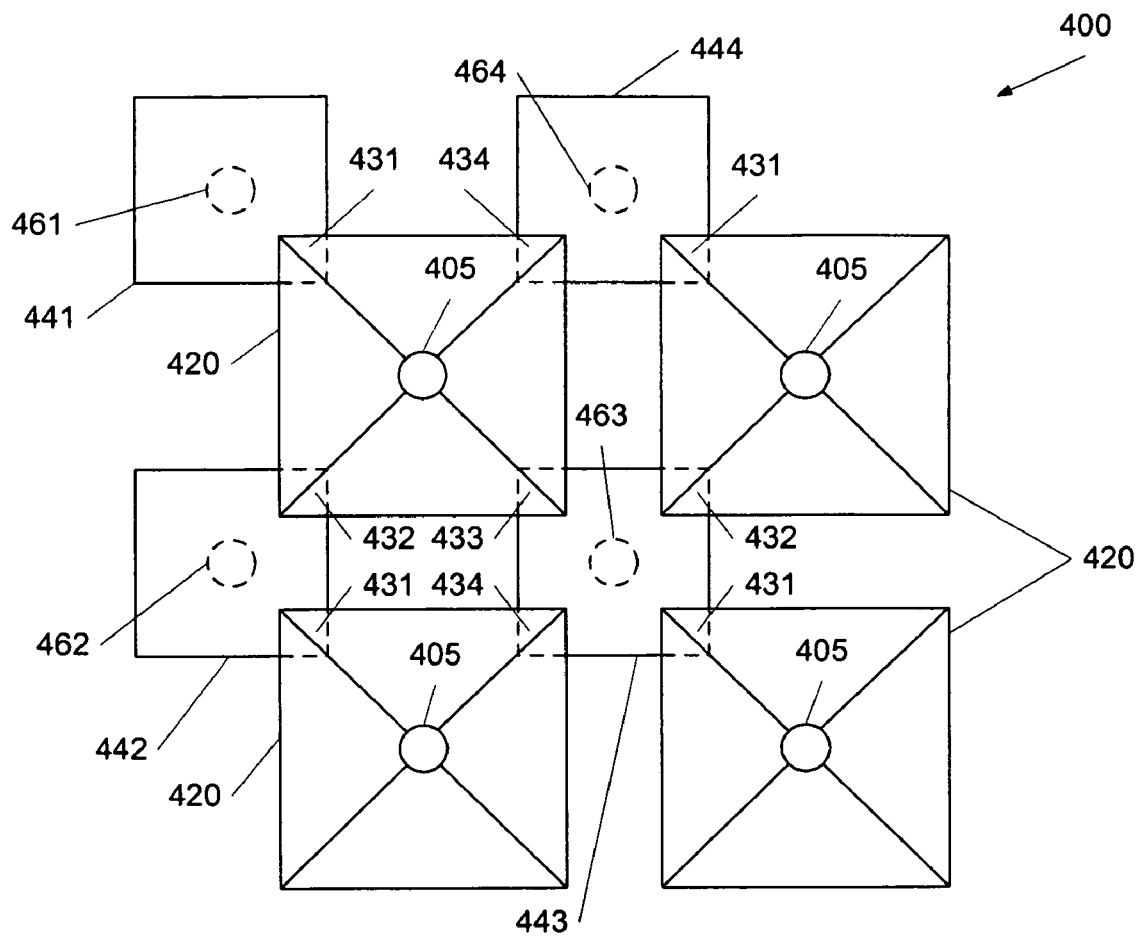
FIG. 4 is a top view of one diode quad memory cells in accordance with a representative embodiment.

Referring to FIG. 4, a top view of one diode quad memory cells 400 in accordance with a representative embodiment is shown. The one diode quad memory cells 400 include first diode steering elements 420, resistivity switching storage elements 431, 432, 433, and 434, and contacts 441, 442, 443, and 444. The first diode steering elements 420 and the contacts 441-444 are generally square or rectangular in shape; however, the shape does not have to be perfectly rectangular.

The first diode steering elements 420 are electrically connected to the resistivity switching storage elements 431-434. In this example, each first diode steering element is connected to four resistivity switching storage elements. The contacts 441-444 are electrically connected to the resistivity switching storage elements 431-434. In this example, each contact is connected to four resistivity switching storage elements. The resistivity switching storage elements 431-434 are located where the first diode steering elements 420 and the contacts 441-444 overlap. Each first diode steering element 420 has a X line contact 405. The X line contact 405 electrically connects the first diode steering elements 420 to X lines (not shown for clarity). Likewise, each contact 441-444 has a Y line contact 461, 462, 463, and 464. The Y line contacts 461-464 electrically connect the contacts 441-444 to Y lines (not shown for clarity). In FIG. 4, the first diode steering elements 420 are located above the contacts 441-444; however, their positions can be reversed.

Figure 5:
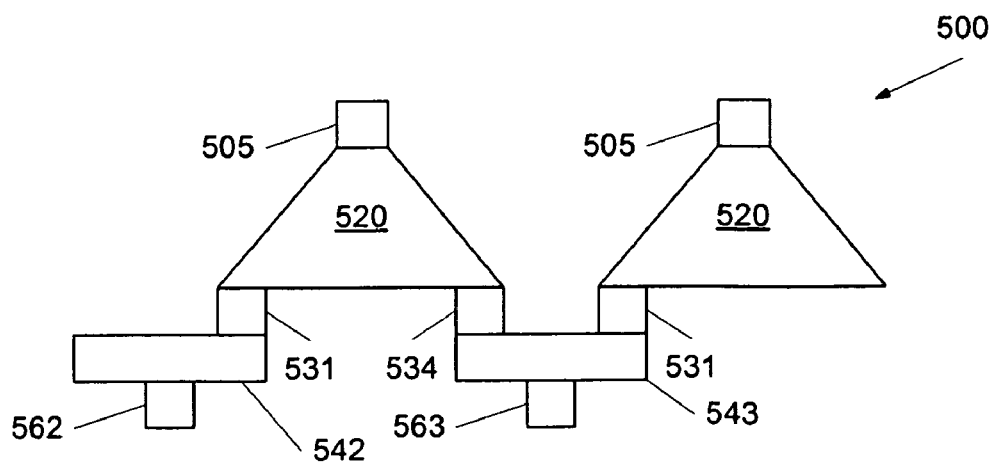
FIG. 5 is a side view of the one diode quad memory cells of FIG. 4 in accordance with a representative embodiment.

Referring to FIG. 5, a side view of the one diode quad memory cells 500 of FIG. 4 in accordance with a representative embodiment is shown. The one diode quad memory cells 500 include first diode steering elements 520, resistivity switching storage elements 531 and 534, and contacts 542 and 543. The first diode steering elements 520 are electrically connected to the resistivity switching storage elements 531 and 534. In this example, each first diode steering element is connected to four resistivity switching storage elements. The contacts 542 and 543 are electrically connected to the resistivity switching storage elements 531 and 534. In this example, each contact is connected to four resistivity switching storage elements. The resistivity switching storage elements 531 and 534 are located where the first diode steering elements 520 and the contacts 542 and 543 overlap. Each first diode steering element 520 has a X line contact 505. The X line contact 505 electrically connects the first diode steering elements 520 to X lines (not shown for clarity). Likewise, each contact 542 and 543 has a Y line contact 562, 563. The Y line contacts 562 and 563 electrically connect the contacts 542 and 543 to Y lines (not shown for clarity). In FIG. 5, the first diode steering elements 520 are above the contacts 542 and 543; however, their positions can be reversed.

Figure 6:
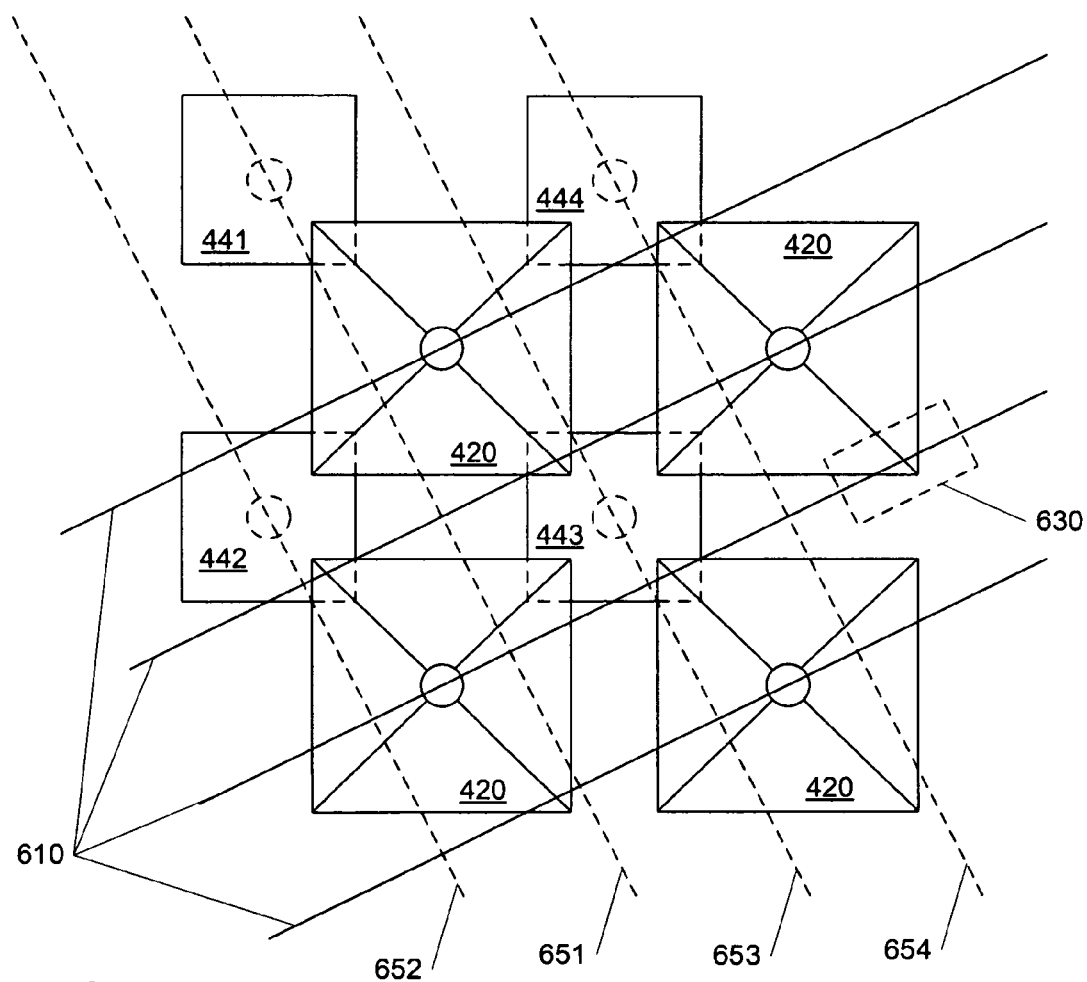
FIG. 6 is a top view of one diode quad memory cells of FIG. 4 with X lines and Y lines in accordance with a representative embodiment.

Referring to FIG. 6, a top view of one diode quad memory cells of FIG. 4 with X lines and Y lines in accordance with a representative embodiment is shown. The one diode quad memory cells include first diode steering elements 420, resistivity switching storage elements (not labeled for clarity) and contacts 441-444 as described with regard to FIG. 4.

Each first diode steering element 420 is electrically connected to a X line 610. More than one first diode steering element 420 is electrically connected to a X line 610. However, a X line preferably does not connect two adjacent diode steering elements to avoid unintentionally activating two adjacent resistivity switching storage elements.

Each contact 441-444 is electrically connected to a Y line 651, 652, 653, 654, respectively. More than one contact is electrically connected to each Y line. However, a Y line preferably does not connect two adjacent diode steering elements to avoid unintentionally activating two adjacent resistivity switching storage elements.

Figure 7:
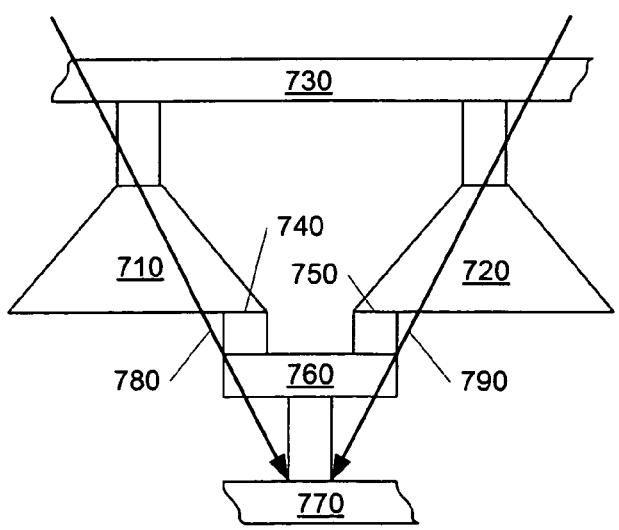
FIG. 7 is a side view of adjacent quad memory cells connected together by the same X line in accordance with a non-preferred embodiment.

The addressing issue results from the layout of the diodes and contacts. Referring to FIG. 7, a side view of adjacent quad memory cells connected together by the same X line in accordance with a non-preferred embodiment is shown. In FIG. 7, a first diode 710 and a second diode 720 are both connected to X line 730. The first diode 710 and the second diode 720 are adjacent. Because the diodes are adjacent, the first diode 710 and the second diode 720 share a contact 760. A first resistivity switching storage element 740 is located between the first diode 710 and the contact 760. A second resistivity switching storage element 750 is located between the second diode 720 and the contact 760. The contact 760 is connected to a Y line 770.

When a voltage is applied across the X line 730 and the Y line 770, both the first diode 710 and the second diode 720 are biased. A first path 780 exists through the first resistivity switching storage element 740 and a second path 790 exists through the second resistivity switching storage element 750. Hence, the first resistivity switching storage element 740 and the second resistivity switching storage element 750 cannot be individually addressed.

Referring again to FIG. 6, since the X lines should not connect adjacent diodes, the individual X lines preferably skip at least every other diode. Consequently, for an array or matrix of diodes [m, n] with m rows and n columns where X lines run generally in the row direction, the number of X lines is greater than the number of rows, m. In a representative embodiment, the X lines skip at least every other diode. Consequently, the number of X lines is approximately two times the number of rows. The number of X lines varies depending on how the edges of the of the array are treated. Likewise, if a X line is connected to every third diode, the number of X lines is approximately three times the number of rows. In a representative embodiment, two X lines are run along a row of diodes, on either side of the row of diodes. Each X line is connected to every other diode in a row by a TiN contact. Likewise, two Y lines are run along a column of contacts, on either side of the column of contacts. Each Y line is connected to every other contact by a TiN contact.

In another embodiment, in order to physically address every other tapered diode, while still addressing all diodes and keeping all of the X lines in one metal layer, the X lines are not run parallel with the rows. Instead, a X line is connected to diodes that are two columns and one row away from each other. Hence, where the diodes are evenly spaced, the X lines 610 run at an angle of approximately 20-40 degrees, such as about 30 degrees, to the diode rows.

Similarly, since the Y lines should not connect adjacent contacts, the individual Y lines preferably skip at least every other contact. Consequently, for an array or matrix of diodes [m, n] with m rows and n columns where Y lines run generally in the column direction, the number of Y lines is greater than the number of columns, n. In a representative embodiment, the Y lines skip at least every other contact. Consequently, the number of Y lines is approximately two times the number of columns. The number of Y lines varies depending on how the edges of the array are treated. Likewise, if a Y line is connected to every third contact, the number of Y lines is approximately three times the number of columns.

In order to physically address every other contact, while still addressing all diodes and keeping all of the Y lines in one metal layer, the Y lines are not run parallel with the columns. Instead, a Y line is connected to contacts that are two rows and one column away from each other. Hence, where the diodes are evenly spaced, the Y lines 610 run at an angle of approximately 20-40 degrees, such as about 30 degrees, to the contact columns.

Figure 8:
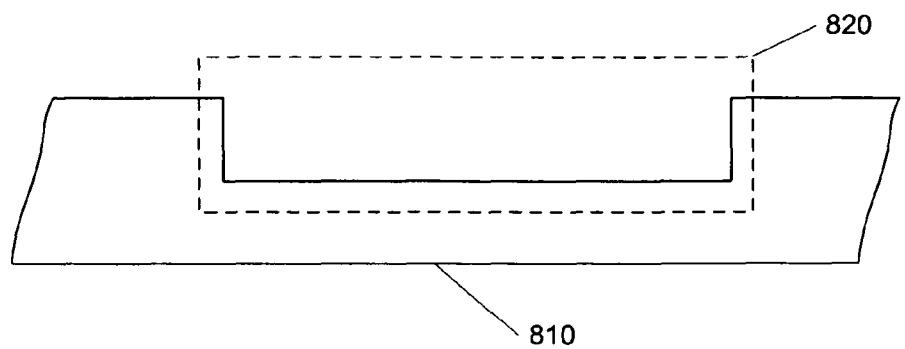
FIG. 8 is a side view of a bypass notched in a X line in accordance with a representative embodiment.

In areas where the X lines or Y lines pass over or near a diode or contact such as area 630, a bypass notch can be created to increase the amount of dielectric material that separates a diode and the passing X line. FIG. 8 depicts a bypass 820 notched in a X line 810 in accordance with a representative embodiment. In subsequent processing steps the notch is filled with dielectric material. Likewise, tapering the diodes increases the amount of dielectric material that separates a diode and the passing X line while reducing the number of layers needed to isolate X lines and Y lines.

Figure 9:
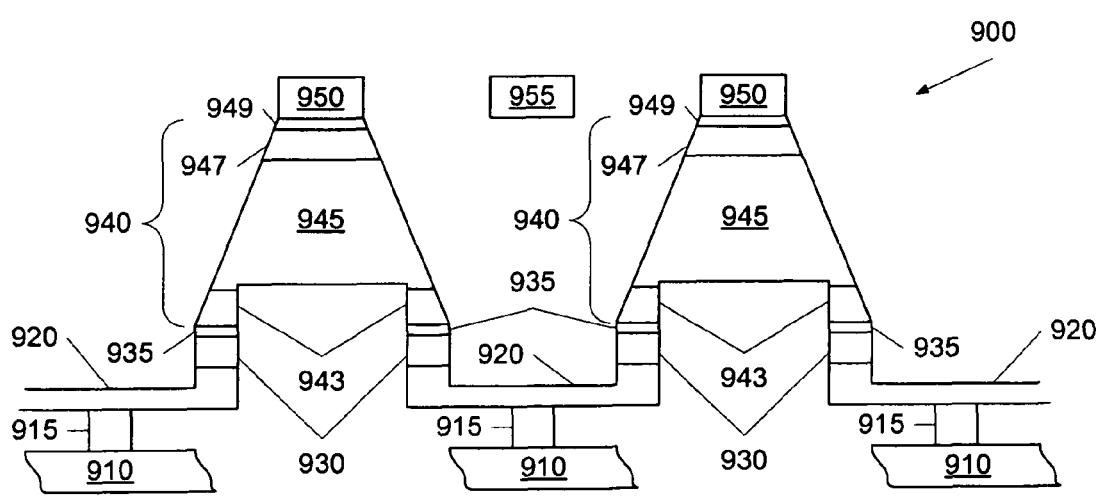
FIG. 9 is a side view of p-i-n-type one diode quad memory cells in accordance with a representative embodiment.

Referring to FIG. 9, a side view of p-i-n-type one diode quad memory cells 900 in accordance with a representative embodiment is shown. The p-i-n-type one diode quad memory cells 900 include word lines 910, contacts 920, resistivity switching storage elements 930, p-i-n diodes 940, and bit lines 950. The word lines 910 are electrically connected to the contacts 920 by word line contacts 915. The contacts 920 and the word line contacts 915 are made of TiN. The resistivity switching storage elements 930 are located at the corners of the contacts 920. The resistivity switching storage elements 930 are connected to the p-i-n diodes 940 by diode contacts 935 which are made of TiN.

In a representative type, the p-i-n diodes 940 include a p-type layer 943, an intrinsic layer 945, and a n-type layer 947. The p-type layer 943 is only located where the p-i-n diodes 940 contact the diode contacts 935 and, thereby, the resistivity switching storage elements 930. Although a continuous p-type layer can be used, a continuous p-type layer creates sneak paths in a memory cell array. For example, where the p-i-n diodes all have a continuous p-type layer, at least one additional conductive path exists between a bit line and a word line. When a bit line and word line are biased, other diodes on the same bit line can find a path back to the word line by routing through the conductive p-type layers of other diodes and the associated TiN contacts. Advantageously, isolating the p-layer and making it discontinuous in each diode significantly reduces the potential unwanted conductive paths in the memory cell array. Alternatively, the n-type layer and p-type layer can be switched so that a discontinuous n-type layer contacts the resistivity switching storage elements 930.

The p-i-n diodes 940 are connected to the bit lines 950 by bit line contacts 949. The bit line contacts 949 are made of TiN. Additionally, the p-i-n diodes 940 are tapered. By tapering the p-i-n diodes 940, bypass bit lines 955 (discussed above) are more electrically isolated from the p-i-n diodes 940 than if a non-tapered diode is used. Bypass bit lines 955 contact adjacent diodes located above and below the plane of the page of FIG. 9.

Figure 10:
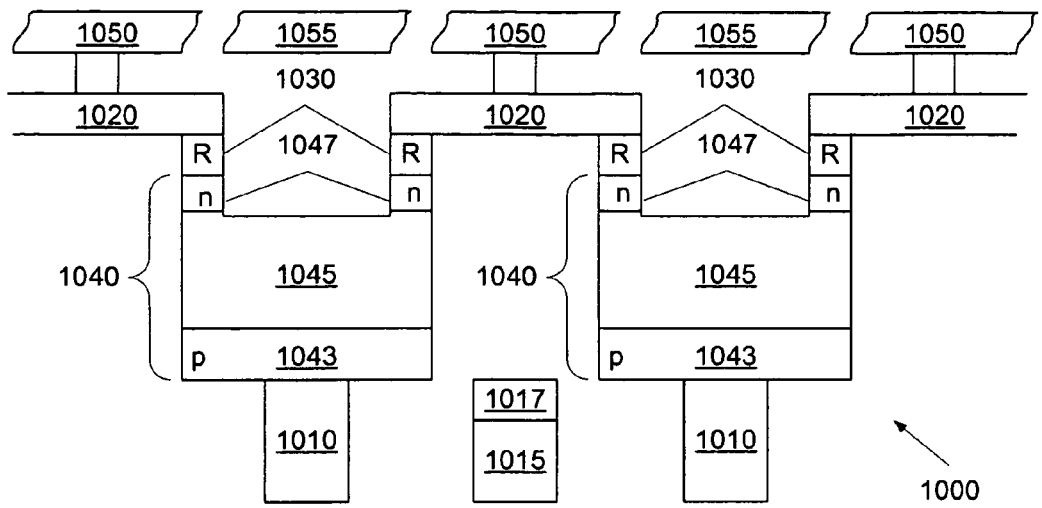
FIG. 10 is a side view of p-i-n-type one diode quad memory cells where the diodes are located below the storage elements in accordance with a representative embodiment.

Referring to FIG. 10, a side view of p-i-n-type one diode quad memory cells 1000 where the diodes are located below the storage elements in accordance with a representative embodiment is shown. (Conductive barrier connections, e.g. TiN, are not shown for clarity.) The p-i-n-type one diode quad memory cells 1000 include word lines 1010, contacts 1020, resistivity switching storage elements 1030, p-i-n diodes 1040, and bit lines 1050. The word lines 1010 are electrically connected to the p-i-n diodes 1040. The resistivity switching storage elements 1030 are located at the corners of the p-i-n diodes 1040. The resistivity switching storage elements 1030 are connected to the corners of the contacts 1020. The contacts 1020 are made of TiN. The contacts 1020 are connected to the bit lines 1050.

In a representative embodiment, the p-i-n diodes 1040 include a p-type layer 1043, an intrinsic layer 1045, and a n-type layer 1047. The n-type layer 1047 is only located where the p-i-n diodes 1040 contact the resistivity switching storage elements 1030. Although a continuous n-type layer can be used, a continuous n-type layer creates sneak paths in a memory cell array. Advantageously, isolating the n-layer significantly reduces the potential unwanted conductive paths in the memory cell array. Alternatively, the n-type layer and p-type layer can be switched so that the p-type layer contacts the resistivity switching storage elements 1030.

In this example, the p-i-n diodes 1040 are not tapered. A bypass word line 1015 passes between the p-i-n diodes 1040 en route to other p-i-n diodes. The bypass word line 1015 has a notch 1017 filled with dielectric material that increases the spacing between the bypass word line and the adjacent p-i-n diodes. Bypass bit lines 1055 pass between the bit lines 1050 en route to other contacts.

Advantageously, the diode area of the first diode steering element is much larger than the contact area of an individual resistivity switching storage element. Consequently, a stronger current can be applied to a resistivity switching storage element than would be possible if the diode area was the same as the area of the memory layer. The tapered shape of the diode and the bypass notch allow bypass lines to be formed on-type layers closer to the diode layer. Additionally, the off-parallel layout of the X lines and Y lines allow the resistivity switch material elements to be individually addressed while reducing the number of layers needed to run address lines.

Structure of a Two Diode Quad Cell

Figure 11:
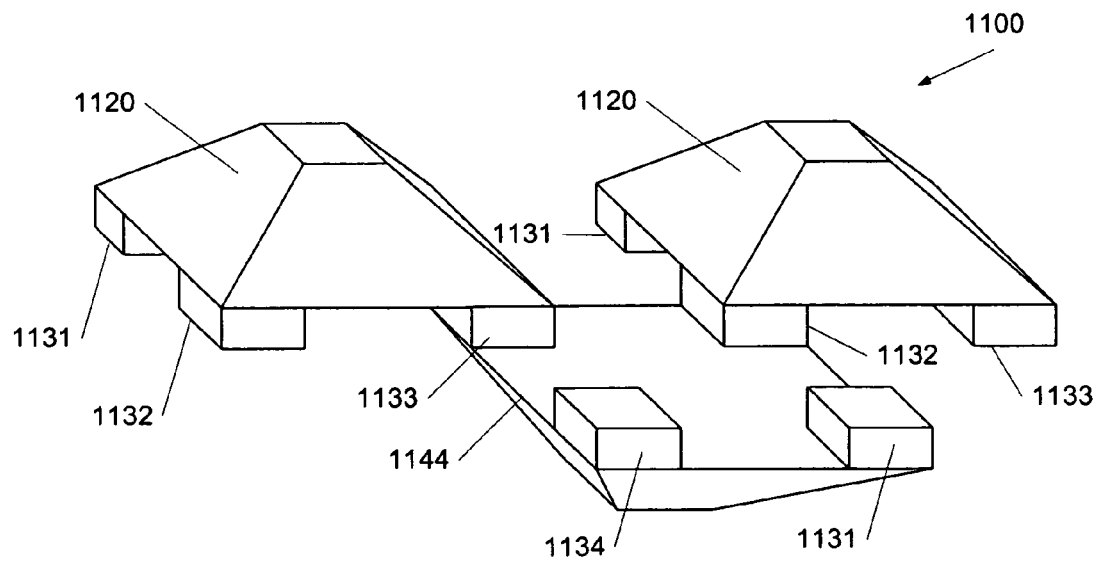
FIG. 11 is a perspective view of two diode quad memory cells in accordance with a representative embodiment.

Referring to FIG. 11, a perspective view of two diode quad memory cells 1100 in accordance with a representative embodiment is shown. The respective circuit schematic of the two diode quad memory cells 1100 is shown in FIG. 2. The two diode quad memory cell is a one diode quad memory cell where the contacts are replaced with diodes. The two diode quad memory cells 1100 include first diode steering element 1120, resistivity switching storage elements 1131, 1132, 1133, and 1134 and a second diode steering elements 1144. The first diode steering element 1120 and second diode steering elements 1144 can be tapered (as depicted) or not tapered. The first diode steering element 1110 is electrically connected to the resistivity switching storage elements 1131-1134. The second diode steering elements 1144 are electrically connected to the resistivity switching storage elements 1131-1134. In this example, each first diode steering element and second diode steering element is connected to four resistivity switching storage elements. The resistivity switching storage elements 1131-1134 are located where the first diode steering element 1120 and the second diode steering elements 1144 overlap. Each first diode steering element and each second diode steering element electrically contact only one common resistivity switching storage element. The first diode steering element 1120 and the second diode steering elements 1144 can be different diode types and/or have different diode properties, e.g. different doping.

Figure 12:
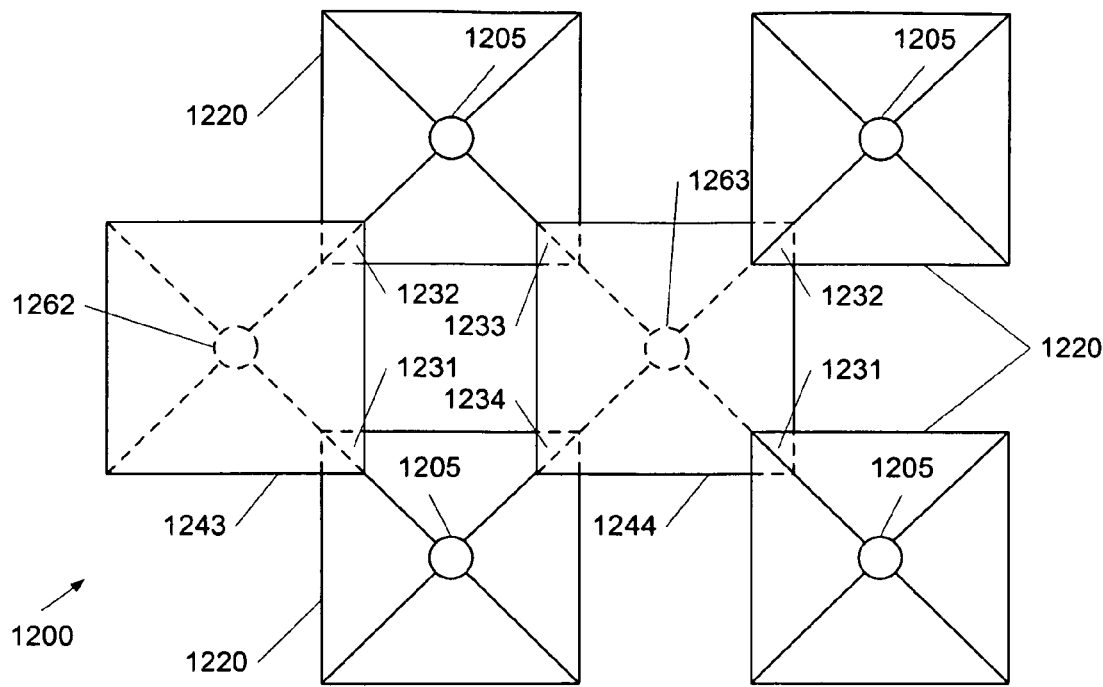
FIG. 12 is a top view of two diode quad memory cells in accordance with a representative embodiment.

Referring to FIG. 12, a top view of two diode quad memory cells 1200 in accordance with a representative embodiment is shown. The two diode quad memory cells 1200 include first diode steering elements 1220, resistivity switching storage elements 1231, 1232, 1233, and 1234 and second diode steering elements 1243 and 1244. The first diode steering elements 1220 are electrically connected to the resistivity switching storage elements 1231, 1232, 1233, and 1234. The second diode steering elements 1243 and 1244 are electrically connected to the resistivity switching storage elements 1231, 1232, 1233, and 1234. In this example, each first diode steering element and each second diode steering element is connected to four resistivity switching storage elements. The resistivity switching storage elements 1231, 1232, 1233, and 1234 are located where the first diode steering elements 1220 and the second diode steering elements 1243 and 1244 overlap. Each first diode steering element 1220 has a X line contact 1205. The X line contact 1205 electrically connects the first diode steering elements 1220 to X lines (not shown for clarity). Likewise, each second diode steering element 1243 and 1244 has a Y line contact 1262 and 1263, respectively. The Y line contacts 1262 and 1263 electrically connect the second diode steering elements 1243 and 1244 to Y lines (not shown for clarity).

Figure 13:
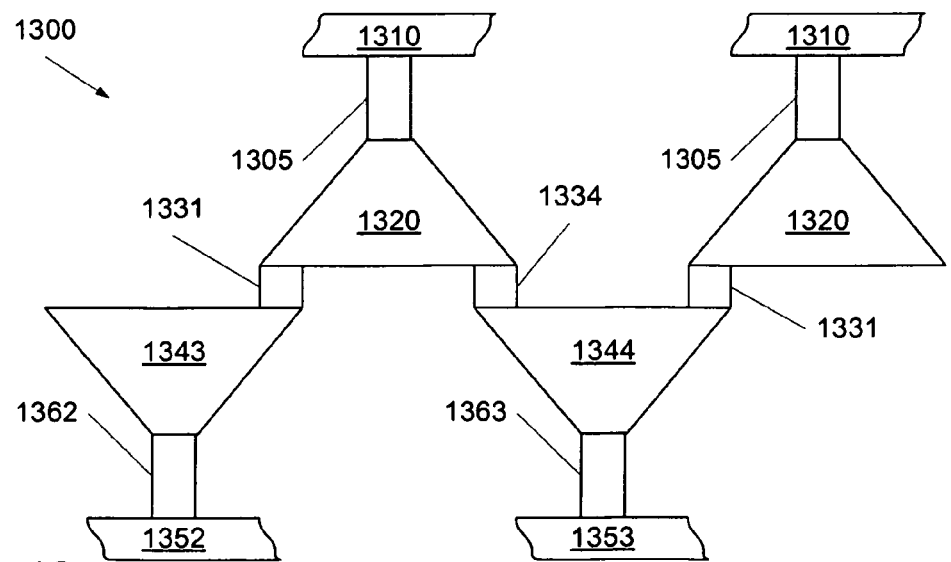
FIG. 13 is a side view of the two diode quad memory cells of FIG. 12 in accordance with a representative embodiment.

Referring to FIG. 13, a side view of the two diode quad memory cells 1300 of FIG. 12 in accordance with a representative embodiment is shown. The two diode quad memory cells 1300 include first diode steering elements 1320, resistivity switching storage elements 1331 and 1334, and second diode steering elements 1343 and 1344. The first diode steering elements 1320 are electrically connected to the resistivity switching storage elements 1331 and 1334. The second diode steering elements 1343 and 1344 are electrically connected to the resistivity switching storage elements 1331 and 1334. In this example, each first diode steering element and each second diode steering element is connected to four resistivity switching storage elements. The resistivity switching storage elements 1331 and 1334 are located where the first diode steering elements 1320 and the second diode steering elements 1343 and 1344 overlap. The first diode steering elements 1320 have X line contacts 1305. The X line contacts 1305 electrically connect the first diode steering elements 1320 to X lines 1310. Likewise, the second diode steering elements 1343 and 1344 have Y line contacts 1362 and 1363, respectively. The Y line contacts 1362 and 1363 electrically connect the second diode steering elements 1343 and 1344 to Y lines 1352 and 1353, respectively. The X lines and Y lines are routed amongst the two diode quad memory cells as described above with regard to FIG. 6.

Figure 14:
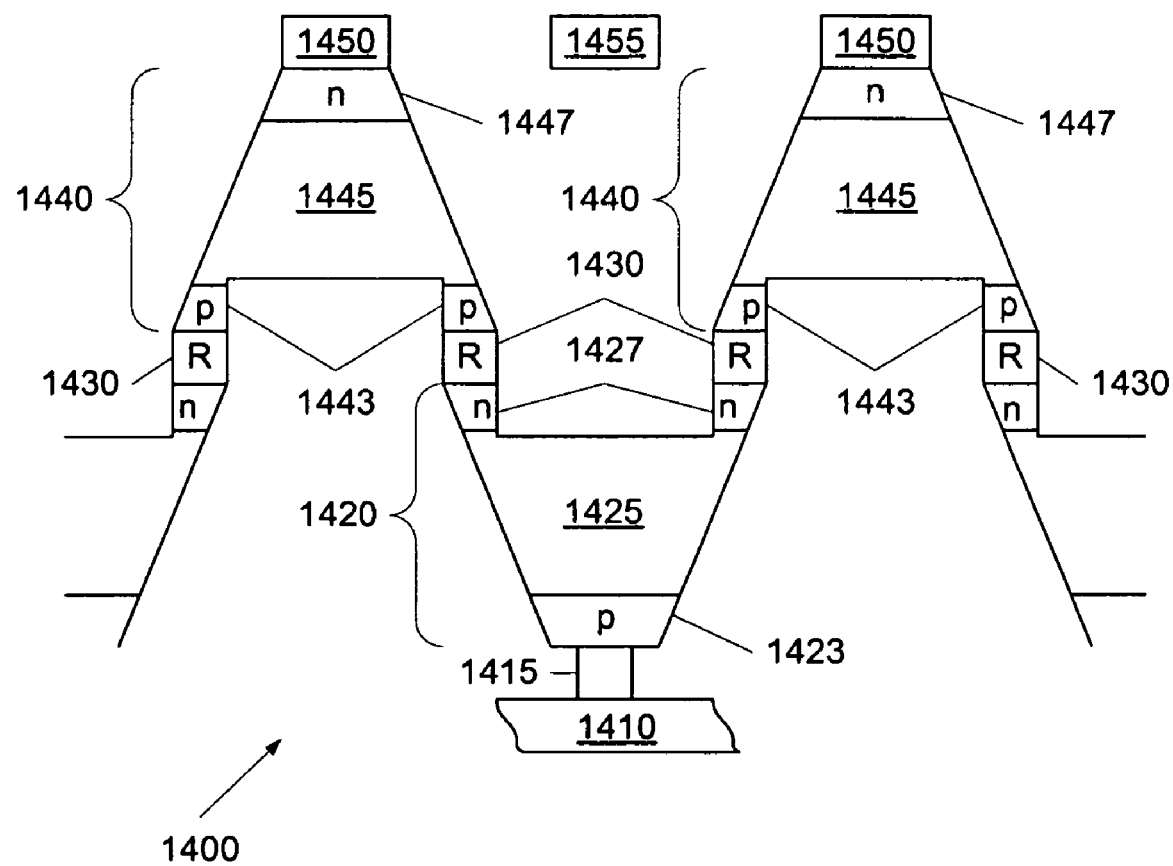
FIG. 14 is a side view of p-i-n-type two diode quad memory cells in accordance with a representative embodiment.

Referring to FIG. 14, a side view of p-i-n-type two diode quad memory cells 1400 in accordance with a representative embodiment is shown. The p-i-n-type two diode quad memory cells 1400 include a word line 1410, a first p-i-n diode 1420, resistivity switching storage elements 1430, second p-i-n diodes 1440, and bit lines 1450. The word line 1410 is electrically connected to the first p-i-n diode 1420 by word contact 1415. The resistivity switching storage elements 1430 are located at the corners of the first p-i-n diode 1420. The resistivity switching storage elements 1430 are also connected to the second p-i-n diodes 1440. The resistivity switching storage elements 1430 are located at the corners of the second p-i-n diodes 1440.

In a representative embodiment, the first p-i-n diode 1420 includes a p-type layer 1423, an intrinsic layer 1425, and a n-type layer 1427. The n-type layer 1427 is only located where the first p-i-n diode 1420 contacts the resistivity switching storage elements 1430. Although a continuous n-type layer can be used, a continuous n-type layer creates sneak paths in a memory cell array.

The second p-i-n diodes 1440 include a p-type layer 1443, an intrinsic layer 1445, and a n-type layer 1447. The p-type layer 1443 is only located where the second p-i-n diodes 1440 contact the resistivity switching storage elements 1430. Although a continuous p-type layer can be used, a continuous p-type layer creates sneak paths in a memory cell array.

The second p-i-n diodes 1440 are connected to the bit lines 1450. Additionally, the second p-i-n diodes 1440 are tapered. By tapering the second p-i-n diodes 1440, bypass bit line 1455 is more electrically isolated from the second p-i-n diodes 1440 than if a straight diode is used. The first p-i-n diode 1420 and second p-i-n diodes 1440 are tapered but can also be non-tapered.

Advantageously, the combined diode area of the first and second diode steering elements is much larger than the contact area of an individual resistivity switching storage element. Consequently, a stronger current can be applied to a resistivity switching storage element than would be possible if the diode area was the same as the area of the memory layer. The tapered shape of the diode and the bypass notch allow bypass lines to be formed on-type layers closer to the diode layer. Additionally, the off-parallel layout of the X lines and Y lines allow the resistivity switch material elements to be individually addressed while reducing the number of layers needed to run address lines.

Multi-Layer Sharing

Figure 15:
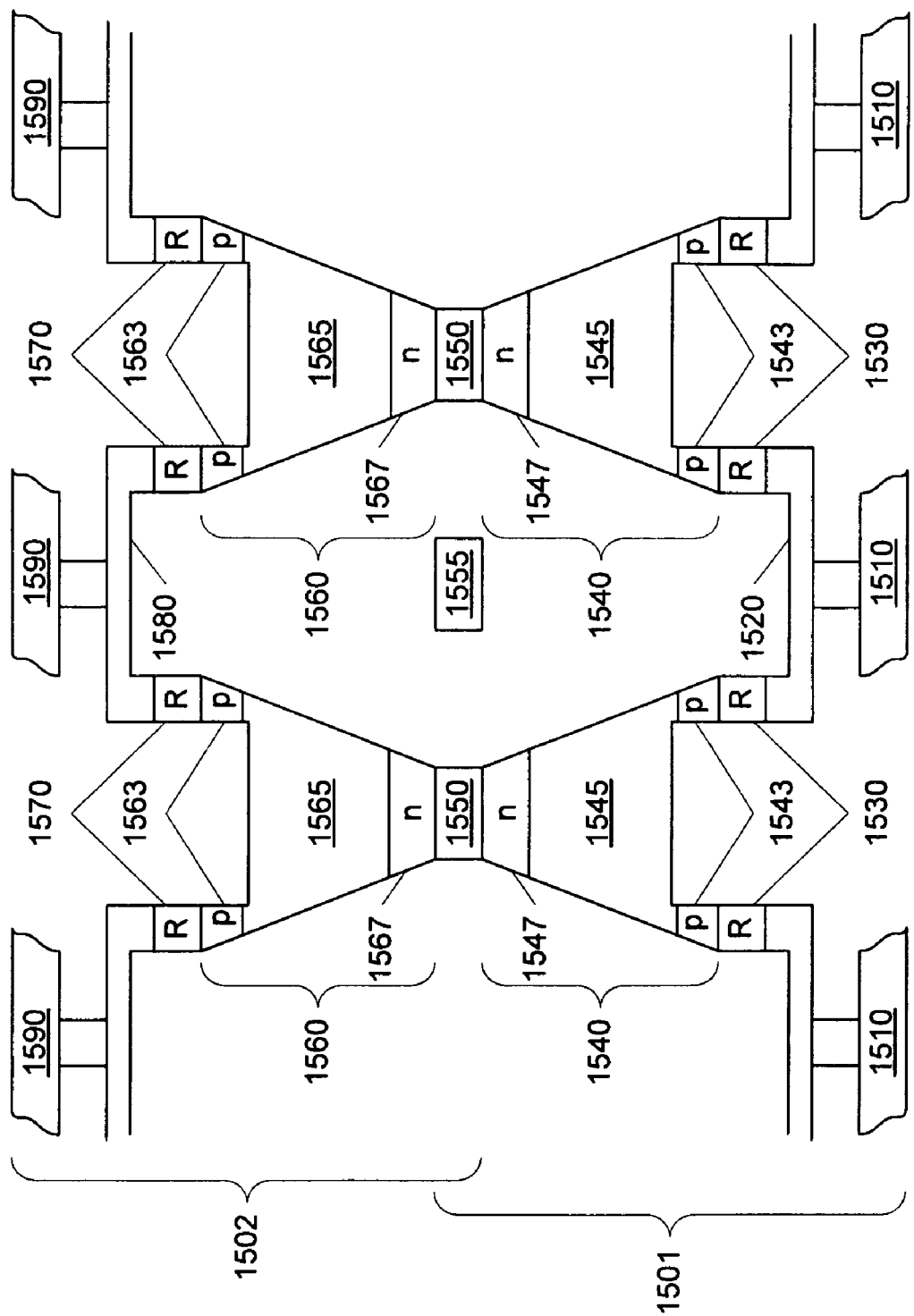
FIG. 15 is a side view of two levels of p-i-n-type one diode quad memory cells in accordance with a representative embodiment.

Referring to FIG. 15, a side view of two levels of p-i-n-type one diode quad memory cells in accordance with a representative embodiment is shown. (Conductive barrier connections, e.g. TiN, are not shown for clarity.) The two levels of p-i-n-type one diode quad memory cells include a first level 1501 and a second level 1502.

The first level 1501 includes first level word lines 1510, first level contacts 1520, first level resistivity switching storage elements 1530, first level p-i-n diodes 1540, and shared bit lines 1550. The first level word lines 1510 are electrically connected to the first level contacts 1520. The resistivity switching storage elements 1530 are connected to the first level contacts 1520 at the corners. The resistivity switching storage elements 1530 are electrically connected to the first level the p-i-n diodes 1540. The resistivity switching storage elements 1530 are located at the corners of the first level p-i-n diodes 1540. The first level p-i-n diodes 1540 are connected to the shared bit lines 1550.

The second level 1502 includes second level word lines 1590, second level contacts 1580, second level resistivity switching storage elements 1570, second level p-i-n diodes 1560, and the shared bit lines 1550. The second level word lines 1590 are electrically connected to the second level contacts 1580. The resistivity switching storage elements 1570 are connected to the second level contacts 1580 at the corners. The resistivity switching storage elements 1570 are electrically connected to the second level the p-i-n diodes 1560. The resistivity switching storage elements 1570 are located at the corners of the second level p-i-n diodes 1560. The second level p-i-n diodes 1560 are connected to the shared bit lines 1550. Additionally, a shared bypass bit line 1555 connects to other first level p-i-n diodes and other second level the p-i-n diodes.

In a representative embodiment, the first level p-i-n diodes 1540 include a p-type layer 1543, an intrinsic layer 1545, and a n-type layer 1547. The p-type layer 1547 is only located where the first level p-i-n diodes 1540 contact the resistivity switching storage elements 1530. The second level p-i-n diodes 1560 include a p-type layer 1563, an intrinsic layer 1565, and a n-type layer 1567. The p-type layer 1563 is only located where the second level p-i-n diodes 1560 contact the resistivity switching storage elements 1570. Hence, the first level 1501 and the second level 1502 share the shared bit lines 1550. The configuration of the first level p-i-n diodes 1540 and the second level p-i-n diodes 1560 allows the first level 1501 and the second level 1502 to be biased simultaneously. Advantageously, the shared bit lines 1550 reduce the cost, materials, and time of manufacturing.

In other embodiments, multiple levels of one or two diode quad cells can be fabricated as a monolithic three dimensional array of devices. The bit lines and/or word lines can be shared between adjacent levels. The bit lines and word lines can be transposed. Additionally, different levels can have different configurations. For example, one level can have one diode quad cells and another level can have two diode quad cells. Likewise, different levels and layers can have different diodes with different diode properties, e.g. doping.

Tri Cell Arrangement

Figure 16:
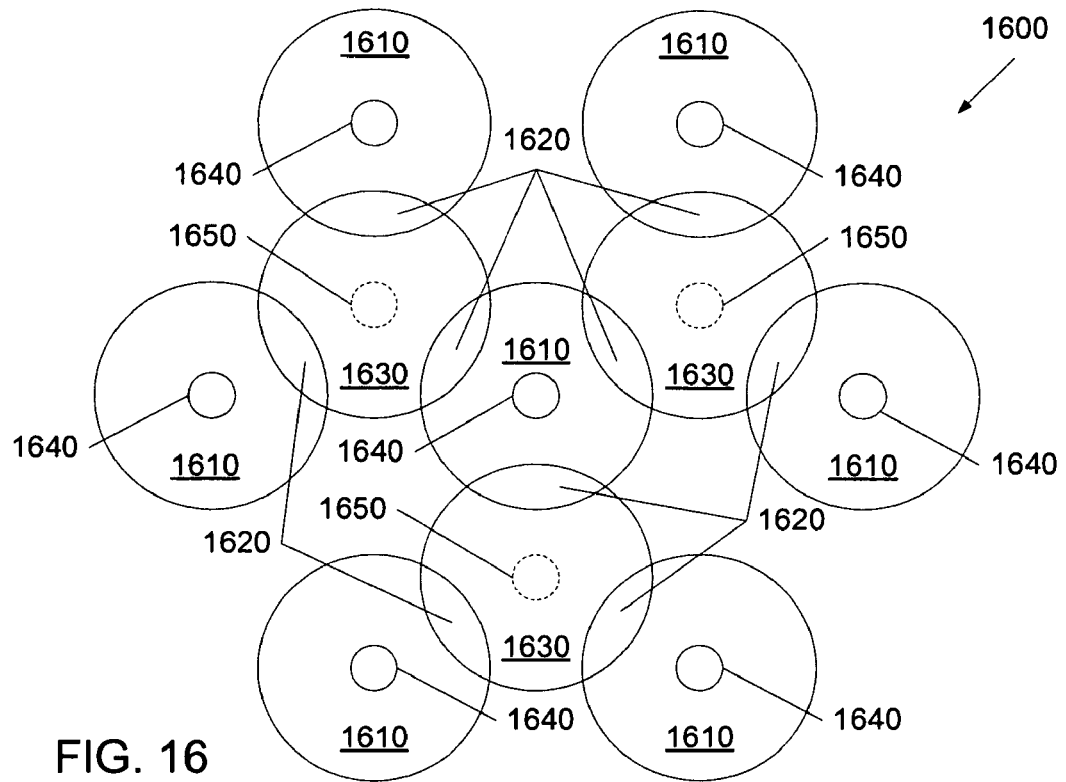
FIG. 16 is a top view of one diode tri memory cells in accordance with a representative embodiment.

Referring to FIG. 16, a top view of one diode tri memory cells 1600 in accordance with a representative embodiment is shown. The one diode tri memory cells 1600 include first diode steering elements 1610, resistivity switching storage elements 1620 and contacts 1630. Alternatively, the contacts 1630 can be replaced with second diode steering elements as described above. The first diode steering elements 1610 and the contacts 1630 are generally circular in shape; however, the shape does not have to be perfectly circular. Other shapes, such as a triangle, can also be used.

The first diode steering elements 1610 are electrically connected to the resistivity switching storage elements 1620. In this example, each first diode steering element is connected to three resistivity switching storage elements. The contacts 1630 are electrically connected to the resistivity switching storage elements 1620. Each contact is connected to three resistivity switching storage elements. The resistivity switching storage elements 1620 are located where the first diode steering elements 1610 and the contacts 1630 overlap. In a representative embodiment, the overlaps occur at the 120 degree positions of each first diode steering element 1610 and each contact 1630 (i.e. elements 1620 are arranged in unit cells of equilateral triangles).

Each first diode steering element 1610 has a X line contact 1640. The X line contact 1640 electrically connects the first diode steering elements 1610 to X lines (not shown for clarity). Likewise, each contact 1630 has a Y line contact 1650. The Y line contact 1650 electrically connects the contacts 1630 to Y lines (not shown for clarity). In FIG. 16, the first diode steering elements 1610 are above the contacts 1630; however, their positions can be reversed.

The first diode steering elements 1610 are arranged in unit cells of equilateral triangles with one contact 1630 in the middle. Advantageously, the triangular unit cell layout results in about a 17% area savings. Alternatively, other repetitive geometric patterns can be used.

Although the first diode steering elements 1610 and the contacts 1630 are arranged in a triangular pattern, the first diode steering elements 1610 and the contacts 1630 are still arranged in arrays with rows and columns. Consequently, the X line and Y line routing techniques discussed above apply equally to tri memory cells.

Fabrication of a One Diode Quad Cell, Diode on Top.

Figure 17:
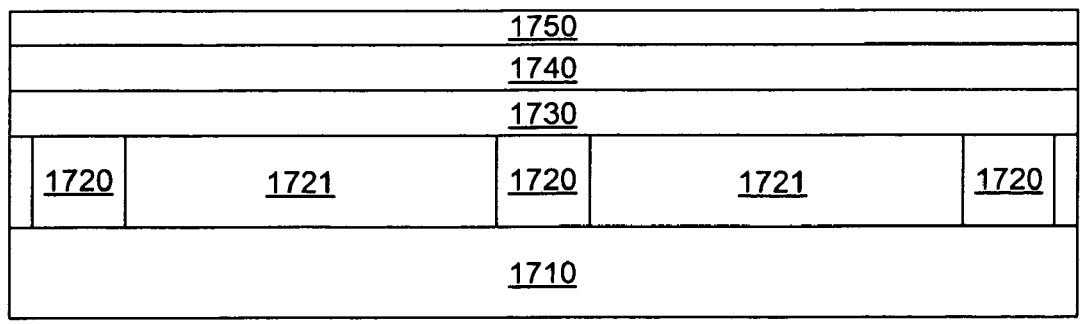
FIG. 17 is a side view of forming first layers of a quad cell array in accordance with a representative embodiment.

Referring to FIG. 17, a side view of forming first layers of a quad cell array in accordance with a representative embodiment is shown. The quad cell array is formed on a substrate 1710. For example, substrate 1710 is silicon, silicon on insulator, or silicon grown on top on an existing memory level. Other semiconductor or non-semiconductor substrates can be used as known in the art. A word line layer is formed on the substrate 1710. The word line layer comprises word lines 1720 separated by an insulating gap fill material 1721.

Next, a contact pad layer 1730 is formed on the word line layer. The contact pad layer 1730 is made of a conductive material, for example, TiN, W, Al, Cu, Ti, etc. The contact pad layer 1730 also includes optional barrier conductors as needed, for example, TiN.

Next, a resistivity switching storage element layer 1740 is formed on the contact pad layer 1730 using any suitable deposition methods, such as thermal CVD, PECVD, sputtering, thermal or plasma oxidation or nitridation, spin-coating, dip coating, etc. The resistivity switching storage element layer 1740 also includes optional barrier conductors as needed, for example, TiN. The resistivity switching storage element layer 1740 comprises a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

Finally, a first diode layer 1750 is formed on the resistivity switching storage element layer 1740. The first diode layer 1750 can be the first part of a diode. In a representative embodiment, a layer of silicon is grown on the resistivity switching storage element layer 1740. The layer of silicon is heavily doped in-situ or after deposition. In FIG. 17, first diode layer 1750 is a heavily doped p-type semiconductor. Layer 1750 can include sublayers comprising a first layer of diode material and a second polish stop layer for CMP stopping.

Figure 18:
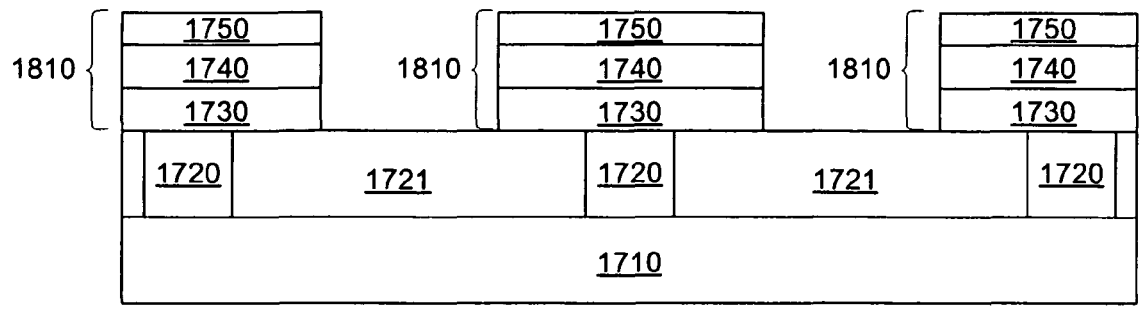
FIG. 18 is a side view of etched first layers of the quad cell array of FIG. 17 in accordance with a representative embodiment.

Referring to FIG. 18, a side view of etched first layers of the quad cell array of FIG. 17 in accordance with a representative embodiment is shown. After the word line layer 1720, the contact pad layer 1730, the resistivity switching storage element layer 1740, and the first diode layer 1750 are formed on the substrate 1710, a layer of photoresist is formed over the first diode layer 1750. The photoresist layer is exposed with a contact pad pattern (a pattern for creating the contacts), developed, and baked as is well known in the art. Alternatively, patterning can be a double exposure or double patterning process, including the use of hard masks, in order to form smaller half pitches. The first diode layer 1750, the resistivity switching storage element layer 1740, and the contact pad layer 1730 are etched through to the word line layer 1720, leaving contact pad structures 1810 and exposing the insulating gap fill material 1721 between word lines 1720. Any etching process can be used depending on the specific materials of the first diode layer 1750, the resistivity switching storage element layer 1740, and the contact pad layer 1730 as is well known in the art.

Figure 19:
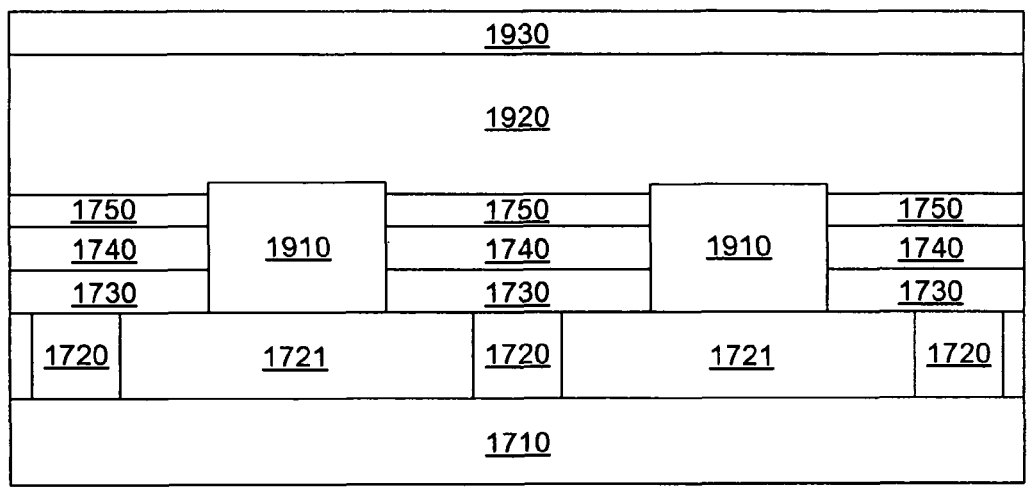
FIG. 19 is a side view of forming second layers of the quad cell array of FIG. 18 in accordance with a representative embodiment.

Referring to FIG. 19, a side view of forming second layers of the quad cell array of FIG. 18 in accordance with a representative embodiment is shown. The trenches between the contact pad structures 1810 are filled with a gap fill insulating material 1910, such as silicon dioxide ($SiO_2$). The surface of the insulating material 1910 is planarized using chemical-mechanical polishing (CMP) or etchback so that the first diode layer 1750 is exposed. Layer 1750 may have several sublayers as discussed above, where only the second sublayer comprising the CMP stop-type layer is exposed.

Finally, a second diode layer 1920 and a third diode layer 1930 are formed on the first diode layer 1750 and the gap fill insulating material 1910. In a representative embodiment, the optional second diode layer 1920 is an intrinsic (i.e., not intentionally doped or lightly doped) layer and the third diode layer 1930 is an n-type layer. The third diode layer 1930 may be formed by implanting n-type dopants into the top part of layer 1920. The first diode layer 1750, the second diode layer 1920 and the third diode layer 1930 can comprise a p-n or p-i-n semiconductor diode. Alternatively, first diode layer 1750 may be n-type and the third diode layer 1930 may be p-type. Alternatively, the first diode layer 1750, the second diode layer 1920 and the third diode layer 1930 can be a metal insulator metal (MIM) diode, a metal insulator-insulator metal (MIIM) diode, tunneling diode, or any two terminal non-linear conducting device. The first diode layer 1750 and the third diode layer 1930 also includes optional barrier conductors as needed, for example, TiN.

Figure 20:
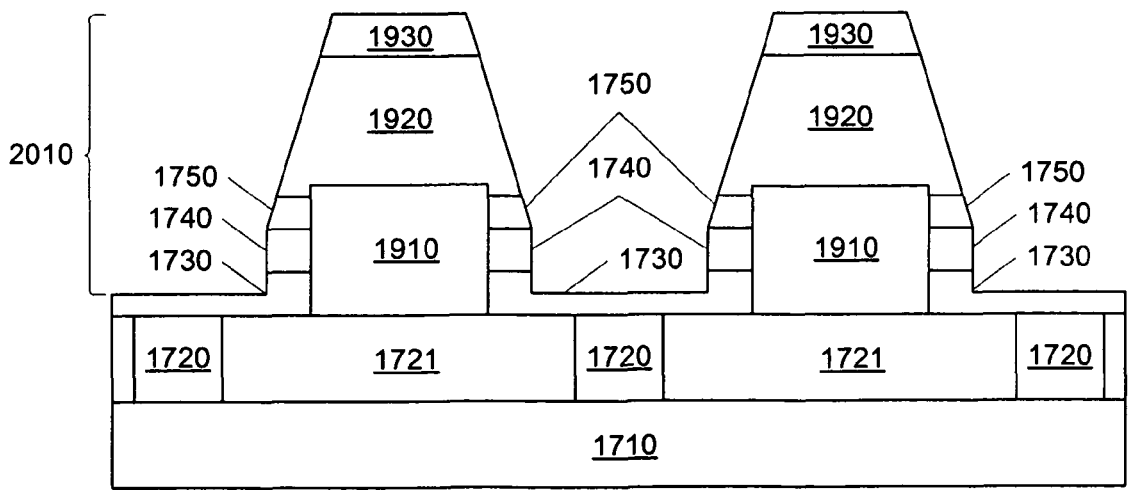
FIG. 20 is a side view of etched second layers of the quad cell array of FIG. 19 in accordance with a representative embodiment.

Referring to FIG. 20, a side view of etched second layers of the quad cell array of FIG. 19 in accordance with a representative embodiment is shown. After the second diode layer 1920 and the third diode layer 1930 are formed on the first diode layer 1750, a layer of photoresist is formed over the third diode layer 1930. The photoresist layer is exposed with a diode pattern (a pattern for creating the diodes), developed, and baked as is well known in the art. Alternatively, patterning can be a double exposure or double patterning process, including the use of hard masks, in order to form smaller half pitches. The third diode layer 1930, the second diode layer 1920, the first diode layer 1750, and the resistivity switching storage element layer 1740 are etched through to the contact pad layer 1730 leaving diode structures 2010. The contact pad layer 1730 can also be etched part way through. Any etching process can be used depending on the specific materials of the third diode layer 1930, the second diode layer 1920, the first diode layer 1750, the resistivity switching storage element layer 1740, and the contact pad layer 1730 as is well known in the art. The etch can be anisotropic or isotropic. In a representative embodiment, the etch is isotropic, leaving tapered diode structures 2010.

Figure 21:
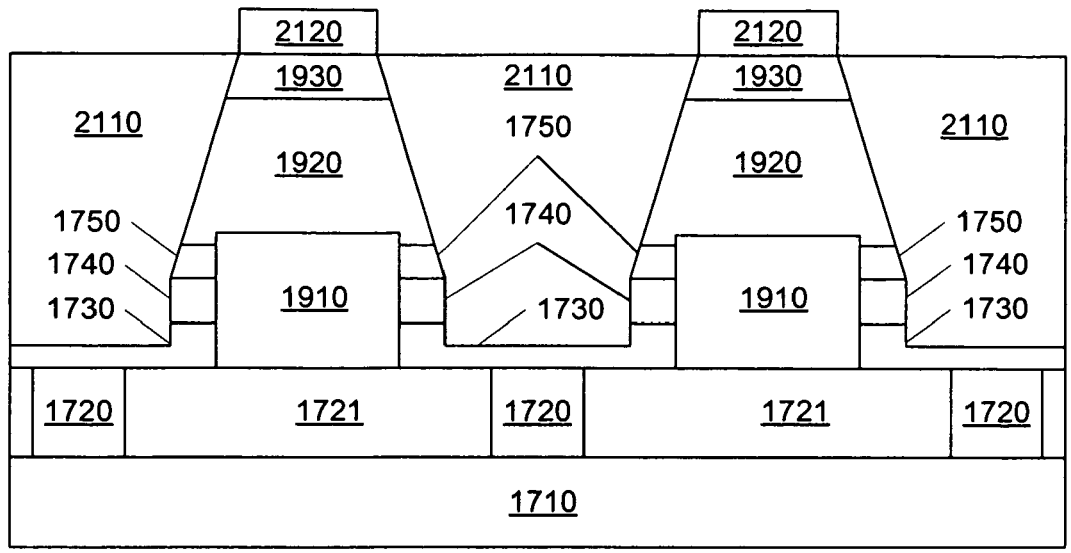
FIG. 21 is a side view of a completed quad cell array of FIG. 20 in accordance with a representative embodiment.

Referring to FIG. 21, a side view of a completed quad cell array of FIG. 20 in accordance with a representative embodiment is shown. The trenches between the diode structures 2010 are filled with a gap fill insulating material 2110, such as silicon dioxide (SiO$_2$). The surface of the insulating material 2110 is planarized using chemical-mechanical polishing (CMP) or etchback so that the third diode layer 1930 is exposed. Layer 1930 may have several sublayers where only a second sublayer comprising the CMP stop-type layer is exposed. Finally, bit lines 2120 are formed across the third diode layer 1930, completing the quad cell array. Thus, each pad 1730 contacts a plurality of diodes and a respective word line 1720.

Advantageously, individual memory cells of the resistivity switching storage element layer 1740 have been formed by self alignment. Hence, the quad cell array is particularly well suited for deep submicron manufacturing processes.

Fabrication of a One Diode Quad Cell Diode on Bottom.

Figure 22:
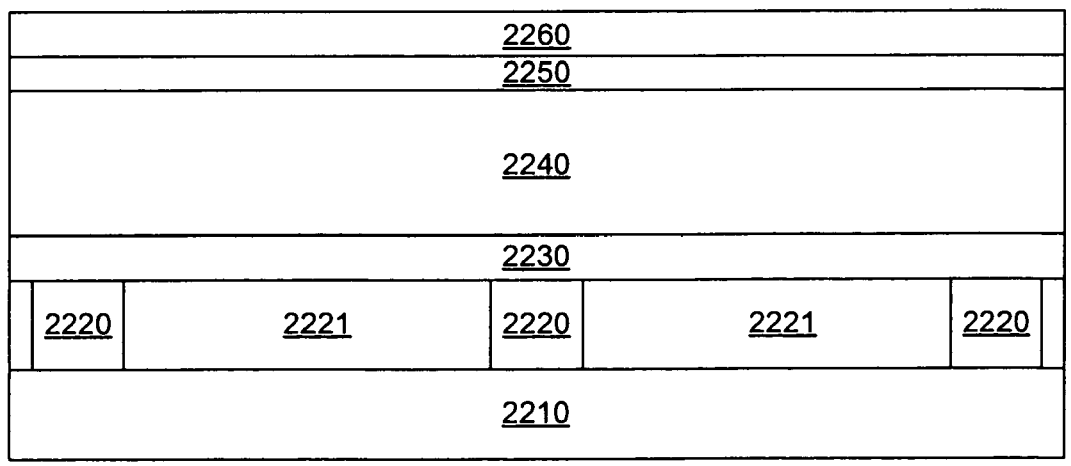
FIG. 22 is a side view of forming first layers of a quad cell array with diode on the bottom in accordance with a representative embodiment.

Referring to FIG. 22, a side view of forming first layers of a quad cell array with diode on the bottom in accordance with a representative embodiment is shown. The quad cell array is formed on a substrate 2210. For example, substrate 2210 is silicon, silicon on insulator, or silicon grown on top on an existing memory level. Other semiconductor or non-semiconductor substrates can be used as known in the art. A word line layer is formed on the substrate 2210. The word line layer comprises word lines 2220 separated by an insulating gap fill material 2221.

Next, a first diode layer 2230, a second diode layer 2240, a third diode layer 2250, and a resistivity switching storage element layer 2260 are formed on the word line layer. The first diode layer 2230, the optional second diode layer 2240, and the third diode layer 2250 form a p-n or p-i-n semiconductor diode. In a representative embodiment, the first diode layer 2230 is a heavily doped p-type layer, the second diode layer 2240 is a lightly doped or intrinsic layer, and the third diode layer 2250 is a heavily doped n-type layer. The positions of the n-type and p-type layers may be reversed. Alternatively, the first diode layer 2230, the second diode layer 2240, and the third diode layer 2250 can be a metal insulator metal (MIM) diode, a metal insulator-insulator metal (MIIM) diode, tunneling diode, or any two terminal non-linear conducting device. The first diode layer 2230 and the third diode layer 2250 also includes optional barrier conductors as needed, for example, TiN.

The resistivity switching storage element layer 2260 is formed using any suitable deposition methods, such as thermal CVD, PECVD, sputtering, thermal or plasma oxidation or nitridation, spin-coating, dip coating, etc. The resistivity switching storage element layer 2260 also includes optional barrier conductors as needed, for example, TiN. The resistivity switching storage element layer 2260 comprises a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

Figure 23:
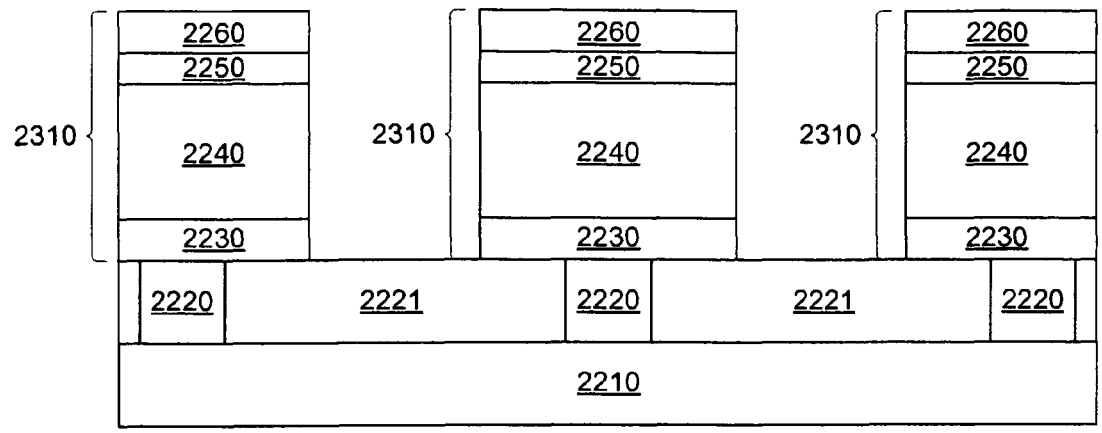
FIG. 23 is a side view of etched first layers of the quad cell array with diode on the bottom of FIG. 22 in accordance with a representative embodiment.

Referring to FIG. 23, a side view of etched first layers of the quad cell array with diode on the bottom of FIG. 22 in accordance with a representative embodiment is shown. After the first diode layer 2230, the second diode layer 2240, the third diode layer 2250, and the resistivity switching storage element layer 2260 are formed on the word line layer 2220, a layer of photoresist is formed over the resistivity switching storage element layer 2260. The photoresist layer is exposed with a diode pattern, developed, and baked as is well known in the art. Alternatively, patterning can be a double exposure or double patterning process, including the use of hard masks, in order to form smaller half pitches. The resistivity switching storage element layer 2260, the third diode layer 2250, the second diode layer 2240, and the first diode layer 2230 are etched through to the word line layer 2220 leaving diode structures 2310. Any etching process can be used depending on the specific materials of the first diode layer 2230, the second diode layer 2240, the third diode layer 2250, and the resistivity switching storage element layer 2260 as is well known in the art.

Figure 24:
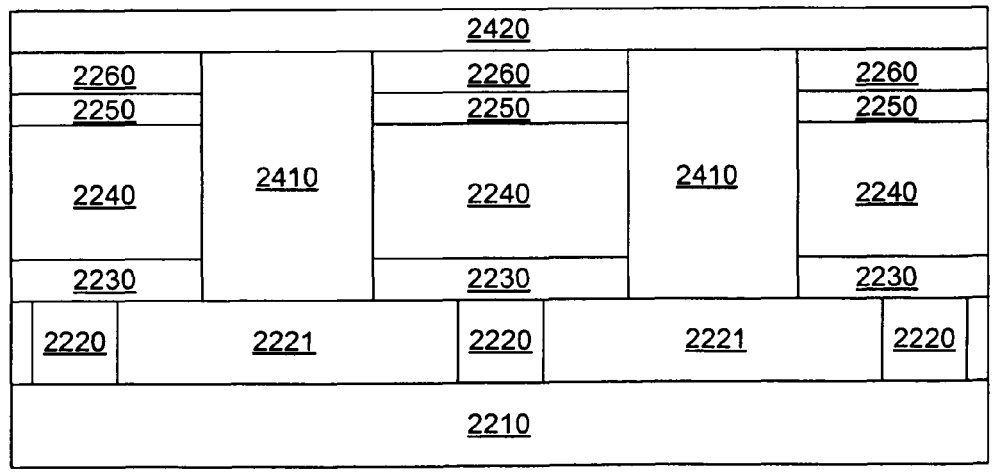
FIG. 24 is a side view of forming second layers of the quad cell array with diode on the bottom of FIG. 23 in accordance with a representative embodiment.

Referring to FIG. 24, a side view of forming second layers of the quad cell array with diode on the bottom of FIG. 23 in accordance with a representative embodiment is shown. The trenches between the diode structures 2310 are filled with a gap fill insulating material 2410, such as silicon dioxide (SiO$_2$). The surface of the insulating material 2410 is planarized using chemical-mechanical polishing (CMP) or etchback so that the resistivity switching storage element layer 2260 is exposed.

Finally, a contact pad layer 2420 is formed on the resistivity switching storage element layer 2260 and the gap fill insulating material 2410. The contact pad layer 2420 is made of a conductive material, for example, TiN, W, Al, Cu, Ti, etc. The contact pad layer 2420 also includes optional barrier conductors as needed, for example, TiN.

Figure 25:
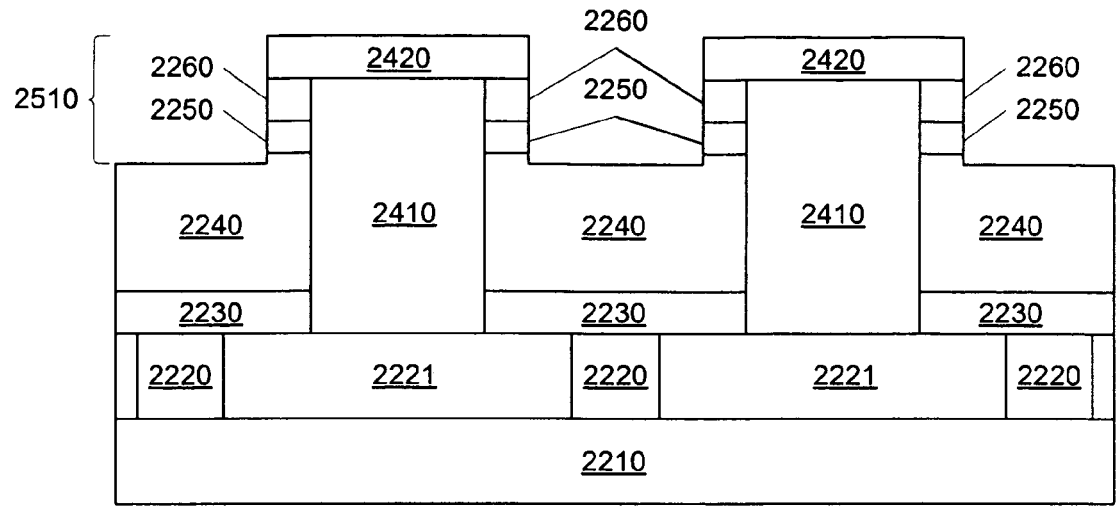
FIG. 25 is a side view of etched second layers of the quad cell array with diode on the bottom of FIG. 24 in accordance with a representative embodiment.

Referring to FIG. 25, a side view of etched second layers of the quad cell array with diode on the bottom of FIG. 24 in accordance with a representative embodiment is shown. After the contact pad layer 2420 is formed on the resistivity switching storage element layer 2260 and the gap fill insulating material 2410, a layer of photoresist is formed over the contact pad layer 2420. The photoresist layer is exposed with a contact pad pattern, developed, and baked as is well known in the art. Alternatively, patterning can be a double exposure or double patterning process, including the use of hard masks, in order to form smaller half pitches. The contact pad layer 2420, the resistivity switching storage element layer 2260, and the third diode layer 2250 are etched through to the second diode layer 2240 leaving contact pad structures 2510. Layers 2250 and 2260 are etched so that they form a plurality of diode portions (e.g. 2250) that each electrically contact one pad 2420. The second diode layer 2240 can also be etched part way through. However, layer 2230 is not etched and is electrically connected to multiple pads 2420 via patterned diode layers 2240, 2250 and 2260, and to a word line 2220. Any etching process can be used depending on the specific materials of contact pad layer 2420, the resistivity switching storage element layer 2260, and the third diode layer 2250 as is well known in the art.

Figure 26:
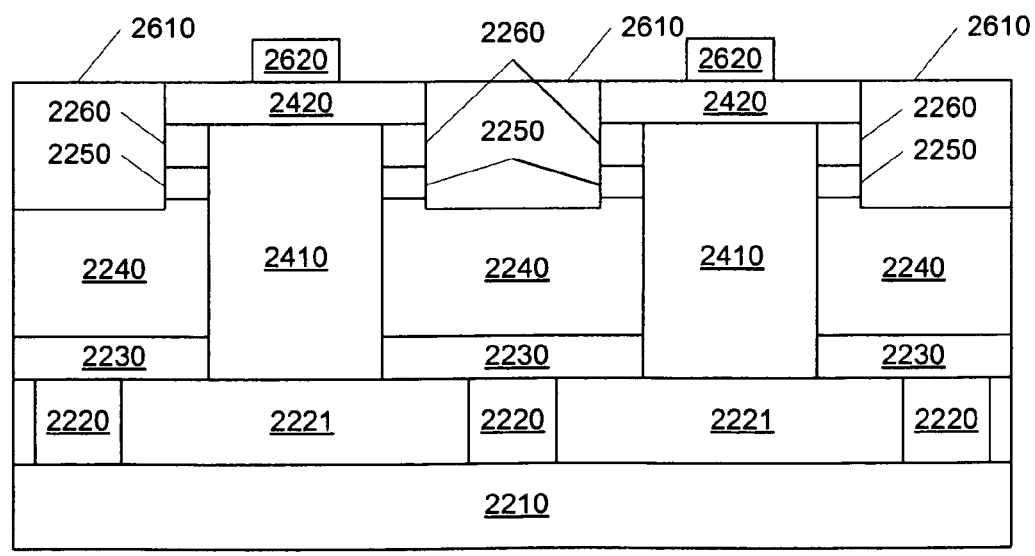
FIG. 26 is a side view of a completed quad cell array with diode on the bottom of FIG. 25 in accordance with a representative embodiment.

Referring to FIG. 26, a side view of a completed quad cell array with diode on the bottom of FIG. 25 in accordance with a representative embodiment is shown. The trenches between the contact pad structures 2510 are filled with a gap fill insulating material 2610, such as silicon dioxide ($SiO_2$). The surface of the insulating material 2610 is planarized using chemical-mechanical polishing (CMP) or etchback so that the contact pad layer 2420 is exposed. Layer 2420 may have several sublayers where only a second sublayer comprising a CMP stop-type layer is exposed. Finally, bit lines 2620 are formed across the contact pad layer 2420, completing the quad cell array with diode on the bottom.

Advantageously, individual memory cells of the resistivity switching storage element layer 2260 have been formed by self alignment. Hence, the quad cell array is particularly well suited for deep submicron manufacturing processes.

Fabrication of a Two Diode Quad Cell

Figure 27:
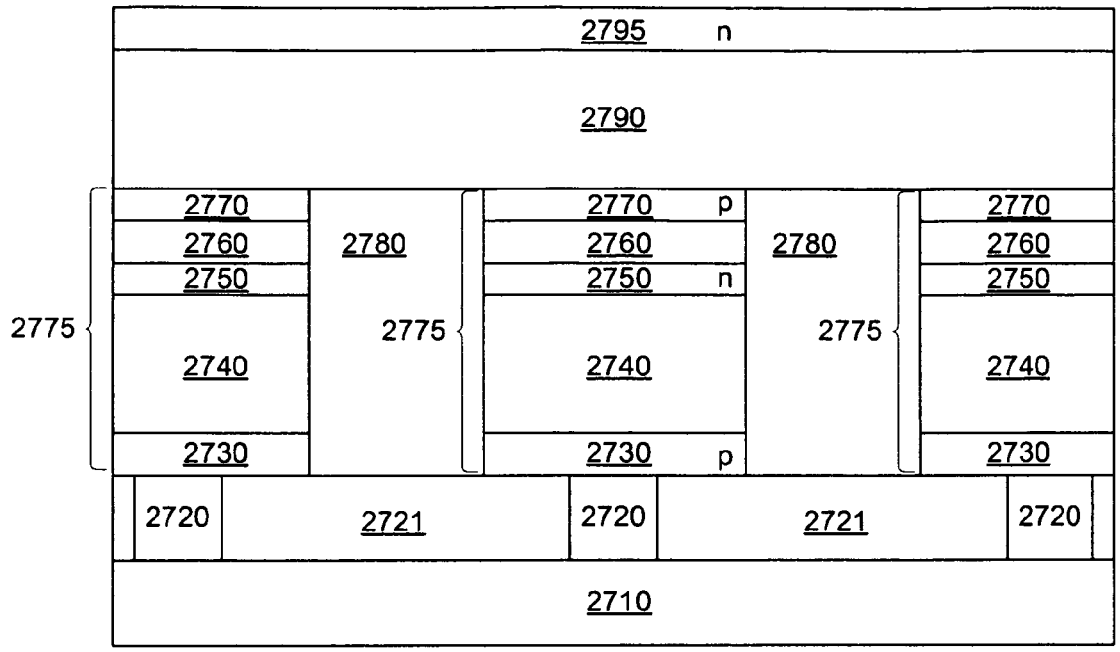
FIG. 27 is a side view of forming a two diode quad cell array in accordance with a representative embodiment.

Referring to FIG. 27, a side view of forming a two diode quad cell array in accordance with a representative embodiment is shown. The two diode quad cell array is formed on a substrate 2710. For example, substrate 2710 is silicon, silicon on insulator, or silicon grown on top on an existing memory level. Other semiconductor or non-semiconductor substrates can be used as known in the art. A word line layer is formed on the substrate 2710. The word line layer comprises word lines 2720 separated by an insulating gap fill material 2721.

Next, a first diode layer 2730, a second diode layer 2740, a third diode layer 2750, a resistivity switching storage element layer 2760, and a fourth diode layer 2770 are formed on the word line layer. The first diode layer 2730, the second diode layer 2740, and the third diode layer 2750 form a p-n or p-i-n semiconductor diode. In a representative embodiment, the first diode layer 2730 is a heavily doped p-type layer, the second diode layer 2740 is a lightly doped or intrinsic layer, and the third diode layer 2750 is a heavily doped n-type layer. Layers 2730 and 2750 can be reversed. However, it is preferred that layers 2750 and 2770 be of opposite conductivity type. The fourth diode layer 2770 is a heavily doped p-type layer. Alternatively, the first diode layer 2730, the second diode layer 2740, and the third diode layer 2750 can be a metal insulator metal (MIM) diode, a metal insulator-insulator metal (MIIM) diode, tunneling diode, or any two terminal non-linear conducting device. The first diode layer 2730 and the third diode layer 2750 also include optional barrier conductors as needed, for example, TiN. The resistivity switching storage element layer 2760 is formed using any suitable deposition methods, such as thermal CVD, PECVD, sputtering, thermal or plasma oxidation or nitridation, spin-coating, dip coating, etc. The resistivity switching storage element layer 2760 also includes optional barrier conductors as needed, for example, TiN.

After the first diode layer 2730, the second diode layer 2740, the third diode layer 2750, the resistivity switching storage element layer 2760 and the fourth diode layer 2770 are formed on the word line layer 2720, a layer of photoresist is formed over the fourth diode layer 2770. The photoresist layer is exposed with a first diode pattern, developed, and baked as is well known in the art. Alternatively, patterning can be a double exposure or double patterning process, including the use of hard masks, in order to form smaller half pitches. The first diode layer 2730, the second diode layer 2740, the third diode layer 2750, the resistivity switching storage element layer 2760 and the fourth diode layer 2770 are etched through to the word line layer 2720 leaving first diode structures 2775. Any etching process can be used depending on the specific materials of the first diode layer 2730, the second diode layer 2740, the third diode layer 2750, the resistivity switching storage element layer 2760 and the fourth diode layer 2770 as is well known in the art.

Next, the trenches between the diode structures 2775 are filled with a gap fill insulating material 2780, such as silicon dioxide ($SiO_2$). The surface of the insulating material 2780 is planarized using chemical-mechanical polishing (CMP) or etchback so that the fourth diode layer 2770 is exposed.

Finally, a fifth diode layer 2790 and a sixth diode layer 2795 are formed on the fourth diode layer 2770 and the gap fill insulating material 2780. The fourth diode layer 2770, the fifth diode layer 2790 and the sixth diode layer 2795 form a p-n or p-i-n semiconductor diode. In a representative embodiment, the fourth diode layer 2770 is a heavily doped p-type layer, the fifth diode layer 2790 is a lightly doped or intrinsic layer, and the sixth diode layer 2795 is a heavily doped n-type layer. Alternatively, fourth diode layer 2770, the fifth diode layer 2790 and the sixth diode layer 2795 can be a metal insulator metal (MIM) diode, a metal insulator-insulator metal (MIIM) diode, tunneling diode, or any two terminal non-linear conducting device. The fourth diode layer 2770 and the sixth diode layer 2795 also include optional barrier conductors as needed, for example, TiN.

Figure 28:
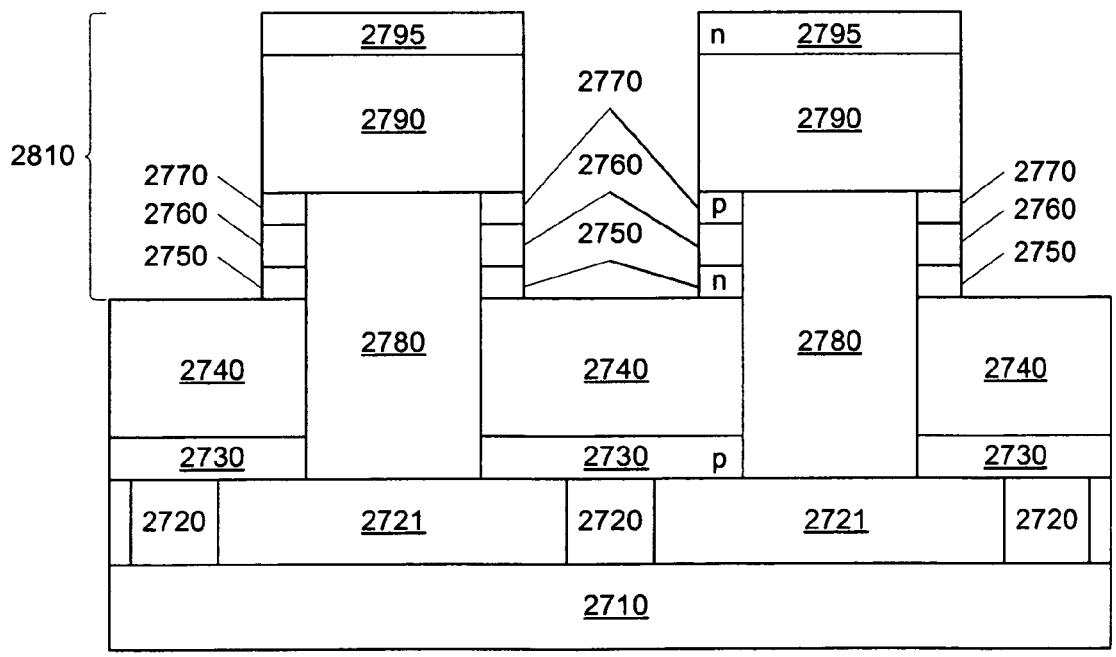
FIG. 28 is a side view of etched second layers of the two diode quad cell array of FIG. 27 in accordance with a representative embodiment.

Referring to FIG. 28, a side view of etched second layers of the two diode quad cell array of FIG. 27 in accordance with a representative embodiment is shown. After the sixth diode layer 2795 is formed, a layer of photoresist is formed over the sixth diode layer 2795. The photoresist layer is exposed with a second diode pattern, developed, and baked as is well known in the art. Alternatively, patterning can be a double exposure or double patterning process, including the use of hard masks, in order to form smaller half pitches. The sixth diode layer 2795, the fifth diode layer 2790, the fourth diode layer 2770, the resistivity switching storage element layer 2760, the third diode layer 2750 are etched through to the second diode layer 2740 leaving second diode structures 2810. The second diode layer 2740 can also be etched part way through, but layer 2730 is preferably not etched. Any etching process can be used depending on the specific materials of the sixth diode layer 2795, the fifth diode layer 2790, the fourth diode layer 2770, the resistivity switching storage element layer 2760, and the third diode layer 2750 as is well known in the art.

Figure 29:
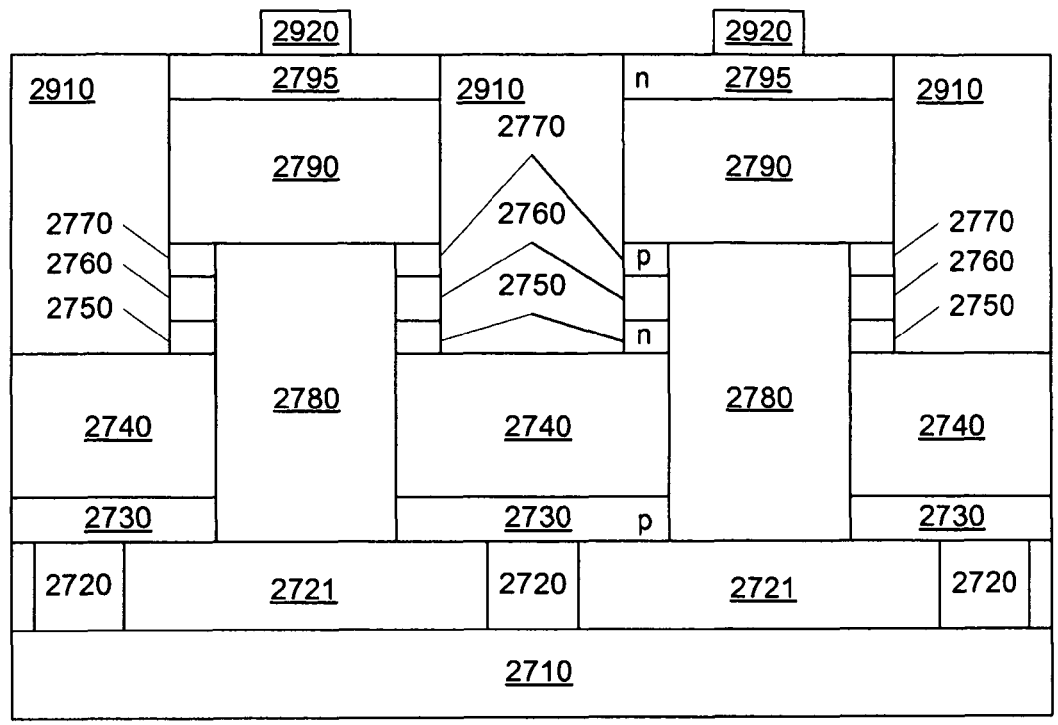
FIG. 29 is a side view of a completed two diode quad cell array of FIG. 28 in accordance with a representative embodiment.

Referring to FIG. 29, a side view of a completed two diode quad cell array of FIG. 28 in accordance with a representative embodiment is shown. The trenches between the second diode structures 2810 are filled with a gap fill insulating material 2910, such as silicon dioxide ($SiO_2$). The surface of the insulating material 2910 is planarized using chemical-mechanical polishing (CMP) or etchback so that the sixth diode layer 2795 is exposed. Layer 2795 may have several sublayers where only a second sublayer comprising a CMP stop-type layer is exposed. Finally, bit lines 2920 are formed across the sixth diode layer 2795, completing the two diode quad cell array.

Advantageously, individual memory cells of the resistivity switching storage element layer 2760 have been formed by self alignment. Hence, the quad cell array is particularly well suited for deep submicron manufacturing processes.

Fabrication of a Quad Cell Using Tapered Openings

The diodes of a quad cell array can also be fabricated by filling openings with diode material. For example, referring to FIG. 30, a side view of forming the first layers of a quad cell array formed using openings in accordance with a representative embodiment is shown. The quad cell array is formed on a substrate 3010. For example, substrate 3010 is silicon, silicon on insulator, or silicon grown on top on an existing memory level. Other semiconductor or non-semiconductor substrates can be used as known in the art. A word line layer is formed on the substrate 3010. The word line layer comprises word lines 3020 separated by an insulating gap fill material 3021.

Next, a first diode layer is formed on the word line layer. In a representative embodiment, the first diode layer is a heavily doped p-type layer. The first diode layer is patterned and etched leaving portions of first diode layer 3030. Gap fill insulating material 3040 is formed between the portions of first diode layer 3030 and planarized.

Figure 30:
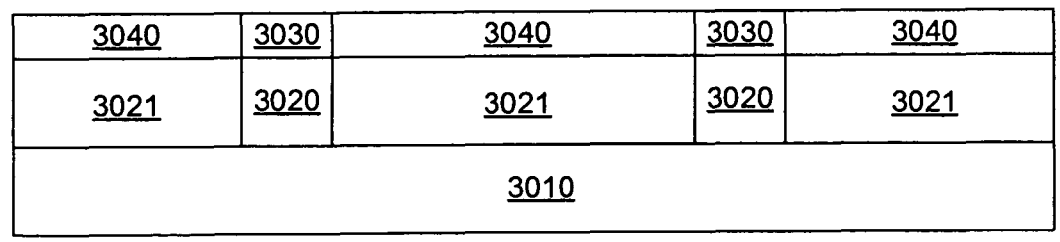
FIG. 30 is a side view of forming first layers of a quad cell array formed using openings in accordance with a representative embodiment.
Figure 31:
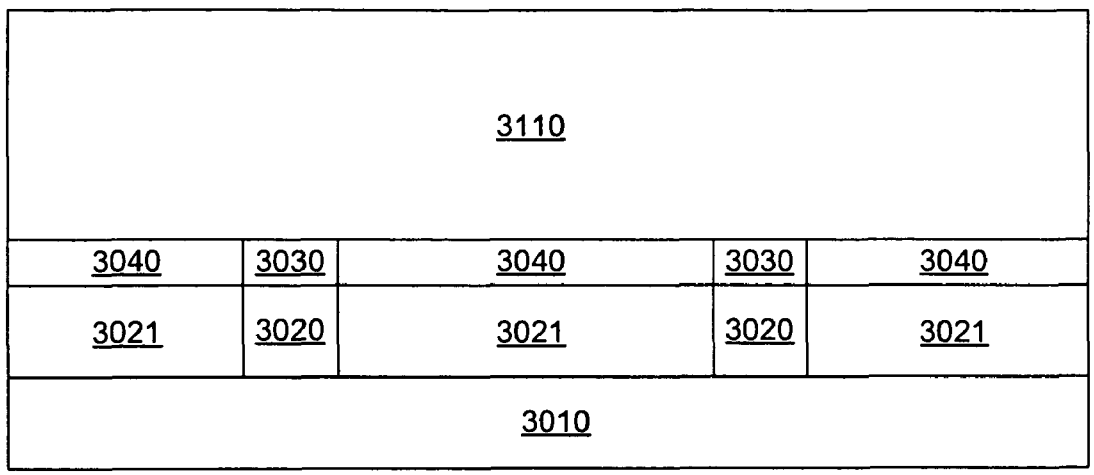
FIG. 31 is a side view of forming a opening layer of the quad cell array formed using openings of FIG. 30 in accordance with a representative embodiment.

Referring to FIG. 31, a side view of forming a opening layer of the quad cell array formed using openings of FIG. 30 in accordance with a representative embodiment is shown. An insulating layer 3110 is formed on the first diode layer 3030 and the gap fill insulating material 3040. The insulating layer 3110 is an insulator such as silicon dioxide ($SiO_2$).

Figure 32:
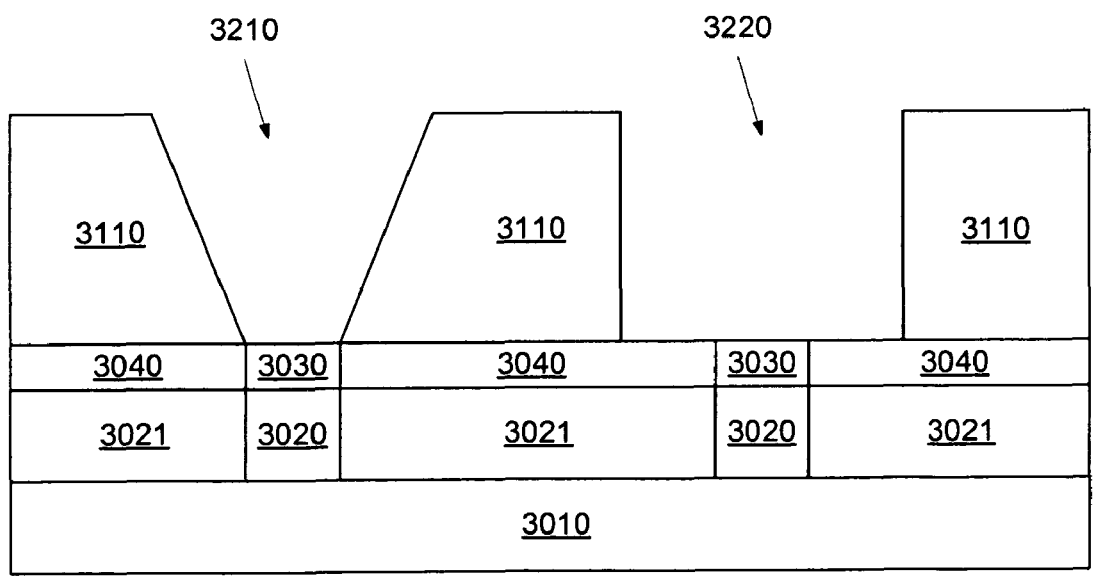
FIG. 32 is a side view of etching a opening layer of the quad cell array formed using openings of FIG. 31 in accordance with a representative embodiment.

Referring to FIG. 32, a side view of etching a opening layer of the quad cell array formed using openings of FIG. 31 in accordance with a representative embodiment is shown. The insulating layer 3110 is etched so that openings are formed above the portions of first diode layer 3030. The openings can be a tapered opening 3210 (wider on the top than on the bottom) or a opening with straight sidewall(s) 3220.

Figures 33, 34:
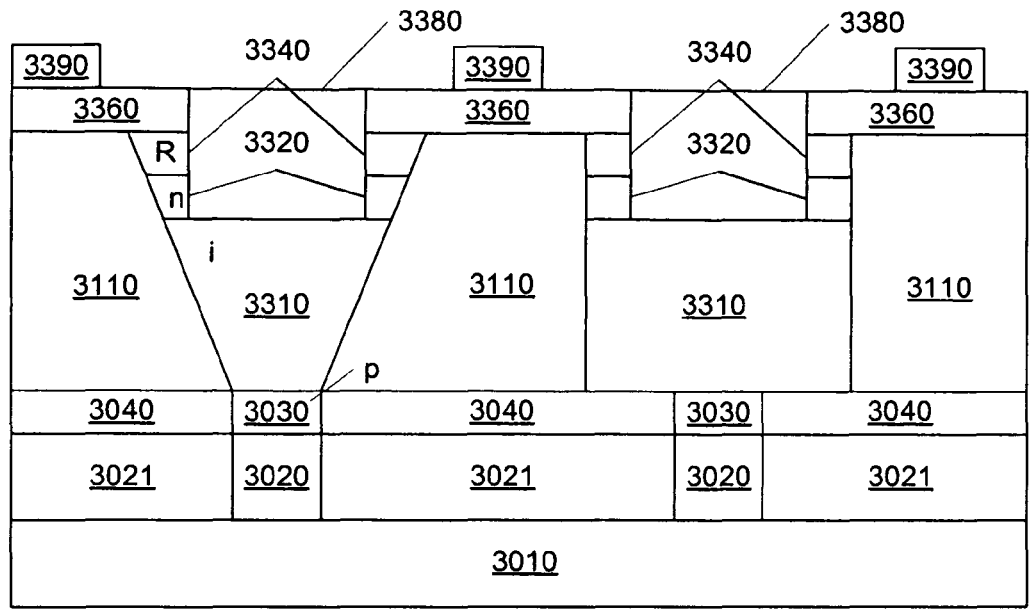
FIG. 33 is a side view of forming a diode of the quad cell array formed using openings of FIG. 32 in accordance with a representative embodiment.
FIG. 34 is a table for sensing a quad cell in accordance with a representative embodiment.

Referring to FIG. 33, a side view of forming a diode of the quad cell array formed using openings of FIG. 32 in accordance with a representative embodiment is shown. The openings are filled with a second diode layer 3310, a third diode layer 3320 and a resistivity switching storage element layer 3340 and are planarized. The second diode layer 3310 and the third diode layer 3320 can be, for example, doped polysilicon or amorphous silicon.

The first diode layer 3030, the second diode layer 3310, and the third diode layer 3320 form a p-n or p-i-n semiconductor diode. In a representative embodiment, the first diode layer 3030 is a heavily doped p-type layer, the second diode layer 3310 is a lightly doped or intrinsic layer, and the third diode layer 3320 is a heavily doped n-type layer. Alternatively, the first diode layer 3030, the second diode layer 3310, and the third diode layer 3320 can be a metal insulator metal (MIM) diode, a metal insulator-insulator metal (MIIM) diode, tunneling diode, or any two terminal non-linear conducting device. The first diode layer 3030 and the third diode layer 3320 also include optional barrier conductors as needed, for example, TiN.

Next, a contact pad layer 3360 is formed. A layer of photoresist is formed over the contact pad layer 3360. The photoresist layer is exposed with a contact pad pattern, developed, and baked as is well known in the art. The contact pad layer 3360, the resistivity switching storage element layer 3340, and the third diode layer 3320 are etched through to the second diode layer 3310 leaving contact pad structures. The second diode layer 3310 can also be etched part way through. Any etching process can be used depending on the specific materials of the contact pad layer 3360, the resistivity switching storage element layer 3340, and the third diode layer 3320 as is well known in the art. The trenches formed by the etch are filled with a gap fill insulating material 3380 and planarized. Finally, bit lines 3390 are formed top of the contact pad layer 3360, completing the quad cell array.

Advantageously, individual memory cells of the resistivity switching storage element layer 3340 have been formed by self alignment. Hence, the quad cell array is particularly well suited for deep submicron manufacturing processes.

Sensing a Quad Cell

Referring to FIG. 34, a table for sensing a quad cell in accordance with a representative embodiment is shown. In parallel with each resistivity switching storage elements are paths up and down between diode electrodes that contact other resistivity switching storage elements. There are two three resistor paths, six five resistor paths, six seven resistor paths, and higher. The net parallel sneak path resistance is equal to about one quad cell resistance. This can vary in a range: from a situation where all sneak paths resistors are "on" to a situation where all sneak path resistors are "off." Mixtures of on and off give less signal interference. This pattern noise interferes with sensing the selected cell. Hence, a read-modify-read method is used to reliably sense a selected cell.

In a representative embodiment, a driver circuit uses a read-modify-read scheme to sense a selected cell. The driver circuit reads the current across the selected cell's respective word line and bit line a first time. Next, the driver circuit forces the selected cell on. The driver circuit reads the current across the selected cell's respective word and bit lines a second time.

Next, the driver circuit compares the first reading with the second reading. If the current changes, it will change by about Ion which is equal to Vread/Ron (where Ion, Vread, and Ron are current, voltage and resistivity of the "on" state). A change in current indicates the original data state was Roff. No change or a small change indicates original data state was Ron. To allow for circuit margins, a reference level of about one-half Ion is used.

In a another embodiment, a driver circuit uses a double read-modify-read scheme to sense a selected cell. The driver circuit reads the current across the selected cell's respective word and bit lines a first time. Next, the driver circuit forces the selected cell on. The driver circuit reads the current across the selected cell's respective word and bit lines a second time. Next, the driver circuit forces the selected cell off. The driver circuit reads the current across the selected cell's respective word and bit lines a third time.

The driver circuit averages the first reading and the third reading. Next, the driver circuit compares the average of the first and third reading to the second reading. If the second reading is higher than the average, this indicates that the state was originally Ron. If the second reading is lower than the average, this indicates that the state was originally Roff.

Advantageously, the double read-modify-read scheme provides more circuit margin in two of the cases where the first reading and second reading are approximately equal.

The table shown in FIG. 34 illustrates a lookup table for determining cell state. A selected cell column 3410 contains the actual state of the selected cell. A effective sneak path column 3420 contains the actual net parallel sneak path resistance for the selected cell. A first read column 3430 contains current readings for a first reading of the selected cell. A second read column 3440 contains current readings for a second reading of the selected cell after the selected cell has been forced on. A third read column 3450 contains current readings for a third reading of the selected cell after the selected cell has been forced off.

A driver circuit can use the lookup table to determine the cell state. For example, where the unforced reading is 2 Ion, the forced on reading is 2 Ion, and the forced off reading is Ion, the state is Ron. The driver circuit interprets Ron as the cell holding a data value of '1'. The lookup tables and sensing schemes change depending on the properties of the quad cell, for instance, depending on the diodes used and type of resistive switching material. Likewise, where a resistivity switching material can hold more than a binary state, the sensing scheme can be expanded to include more readings and state changes. Moreover, the sensing schemes can occur in different orders. Advantageously, the quad cell array can be easily read despite the existence of multiple sneak paths.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on one layer of memory cells. The present invention, however, is not limited to one layer. Those skilled in the art will recognize that the device and methods of the present invention may be practiced using multiple levels of memory cells that are mirrored, half mirrored, or have separate X-line and Y line layers as is well known in the art of three dimensional memory arrays. In a half mirrored arrangement the Y-line is shared between two levels of memory cells. The Y-line has diode layers both above and below. Additionally, the order of fabrication of the layers may be changed without deviating from the spirit of the invention. For example, there are many ways of forming a p-i-n diode as are well known in the art; the formation techniques described above were chosen by way of example and are not limiting. Likewise, the device and methods of the present invention may be practiced using other passive element memory systems. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S. patent application Ser. No. 10/185,508 by Cleeves, filed Jun. 27, 2002, entitled "Three Dimensional Memory", each of which is hereby incorporated by reference.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array. The memory cell may incorporate a reprogrammable memory material for which the conductivity may decrease or increase after application of a suitable electrical pulse.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+ region separated from an n− region by an antifuse element. When the antifuse element is programmed, the p+ region is electrically connected to the n− region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference. Memory cells comprising resistance change materials including transition metal oxides, as described in more detail in U.S. patent application Ser. No. 11/287,452 by Herner, et al. which is hereby incorporated by reference, carbon nanotube layers, which may be formed as described in US Patent Pub 20050269553 Sen, Rahul; et al. which is hereby incorporated by reference, and amorphous, polycrystalline or microcrystalline carbon-type layers can also be used.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. Pat. No. 6,618,295, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

In the above description, an array line is generally shared by two levels of the memory array (i.e., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above) so that the anode terminals are connected to bit lines and the cathode terminals to word lines, or may reverse the directionality of memory cells in the adjacent plane (e.g., a serial chain diode stack memory array as described in U.S. patent application Ser. No. 09/897,705 by Kleveland, et al., referred to above). Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. All patents and patent applications mentioned herein are incorporated by reference in their entirety.

What is claimed is:

1. A non-volatile memory device comprising:
a first electrode;
a diode steering element;
at least three resistivity switching storage elements; and
a second electrode;
wherein the diode steering element comprises a tapered diode which contacts the first electrode with a first side and which contacts the at least three resistivity switching storage elements with corners of an opposite second side which is wider than the first side; and
the second electrode electrically contacts only one of the at least three resistivity switching storage elements.

2. The device of claim 1, wherein the at least three resistivity switching elements comprise four resistivity switching storage elements.

3. The device of claim 1, wherein:
the first electrode comprises a first bit line;
the second electrode comprises a first word line; and
each of the at least three resistivity switching storage elements electrically contacts a different word line.

4. The device of claim 3, wherein:
the diode steering element and each of the at least three resistivity switching storage elements comprises a cell of one time programmable memory or a cell of rewritable nonvolatile memory;
the diode steering element comprises a p-n semiconductor diode, a p-i-n semiconductor diode, a metal insulator metal (MIM) diode, or a metal insulator-insulator metal (MIIM) diode; and
the resistivity switching storage elements comprise a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

5. The device of claim 4, wherein a p-type layer of the diode steering element exists only where the resistivity switching storage elements contact the diode steering element.

6. The device of claim 4, wherein a n-type layer of the diode steering element exists only where the resistivity switching storage elements contact the diode steering element.

7. The device of claim 4, wherein the cells comprise a monolithic, three dimensional array of nonvolatile memory cells.

8. A non-volatile memory device comprising:
a first electrode;
a diode steering element;
three resistivity switching storage elements; and
a second electrode;
wherein:
the diode steering element electrically contacts the first electrode and the three resistivity switching storage elements; and
the second electrode electrically contacts only one of the three resistivity switching storage elements; and further comprising:
a plurality of diode steering elements,
wherein the plurality of diode steering elements is arranged in unit cells of equilateral triangles.

9. A non-volatile memory device comprising:
a first electrode;
a first diode steering element;
four switching storage elements;
a second diode steering element; and
a second electrode;
wherein:
the first diode steering element electrically contacts the first electrode and the four resistivity switching storage elements; and
the second diode steering element electrically contacts the second electrode and only one of the four resistivity switching storage elements; and
wherein:
the first diode steering element, the second diode steering element, and one of the four resistivity switching storage elements comprise a cell of one time programmable memory or a cell of rewritable nonvolatile memory;
the first diode steering element and the second diode steering element comprise a p-n semiconductor diode, a p-i-n semiconductor diode, a metal insulator metal (MIM) diode, or a metal insulator-insulator metal (MIIM) diode; and
the four resistivity switching storage elements comprise a resistivity switching material selected from an antifuse dielectric, fuse, diode and antifuse dielectric arranged in a series, a polysilicon memory effect material, a metal oxide or switchable complex metal oxide material, a carbon nanotube material, a graphene switchable resistance material, a phase change material, a conductive bridge element, an electrolyte switching material, a switchable polymer material, or a carbon resistivity switching material.

10. The device of claim 9, wherein a p-type layer of the diode steering elements exists only where the resistivity switching storage elements contact the diode steering element.

11. The device of claim 9, wherein a n-type layer of the diode steering elements exists only where the resistivity switching storage elements contact the diode steering element.

12. The device of claim 9, wherein the cells comprise a monolithic, three dimensional array of nonvolatile memory cells.

13. The device of claim 12, wherein:
the first diode steering element comprises a tapered diode which electrically contacts the first electrode with a first side and which contacts the four resistivity switching storage elements with an opposite second side which is wider than the first side, and
the second diode steering element comprises a tapered diode which electrically contacts the second electrode with a third side and which contacts only one of the four resistivity switching storage elements with an opposite fourth side which is wider than the third side.

14. A non-volatile memory device comprising:
a first electrode;
a first diode steering element;
three resistivity switching storage elements;
a second diode steering element; and
a second electrode;
wherein:
the first diode steering element electrically contacts the first electrode and the three resistivity switching storage elements, and the second diode steering element electrically contacts the second electrode and only one of the three resistivity switching storage elements; and further comprising:
a plurality of diode steering elements,
wherein the plurality of diode steering elements is arranged in unit cells of equilateral triangles.

15. A non-volatile memory device comprising:
a first diode steering element;
a first bit line electrically contacting the first diode steering element;
at least three resistivity switching storage elements;
a first word line,
wherein the first diode steering element electrically contacts the at least three resistivity switching storage elements, and the first word line electrically contacts only one of the at least three resistivity switching storage elements;
a second diode steering element which is located adjacent to the first diode steering element;
a second bit line electrically contacting the second diode steering element; and
at least three additional resistivity switching storage elements,
wherein the first diode steering element electrically contacts the at least three additional resistivity switching storage elements, and the first word line electrically contacts only one of the at least three additional resistivity switching storage elements; and
a by-pass bit line located between the first and the second bit lines,
wherein the by-pass bit line does not electrically contact the first diode steering element or the second diode steering element.

16. The device of claim 15, wherein the at least three resistivity switching elements comprise four resistivity switching storage elements, and wherein the at least three additional resistivity switching storage elements comprise four additional resistivity switching storage elements.

17. The device of claim 15, wherein the at least three resistivity switching elements comprise three resistivity switching storage elements and wherein the at least three additional resistivity switching storage elements comprise three additional resistivity switching storage elements.

18. The device of claim 15, wherein the first word line directly electrically contacts the one of the least three resistivity switching elements and the first word line directly electrically contacts the one of the least three additional resistivity switching elements such that the direct electrical contact does not pass through a diode.

19. The device of claim 15, further comprising:
a third diode steering element, wherein the third diode steering element is located vertically between the first word line and the at least three resistivity switching storage elements, and wherein the third diode steering element directly electrically contacts the first word line, only one of the at least three resistivity switching storage elements, and only one of the at least three additional resistivity switching storage elements;
a fourth diode steering element which is located adjacent to the third diode steering element;
a second word line, wherein the fourth diode steering element electrically contacts the second word line, only another one of the at least three resistivity switching storage elements, and only another one of the at least three additional resistivity switching storage elements such that the third diode steering element and the fourth diode steering element do not electrically contact common resistivity switching storage elements; and
a by-pass word line located between the first and the second word lines.

20. The device of claim 19, wherein the by-pass word line does not electrically contact the third diode steering element or the fourth diode steering element.

21. A memory array comprising:
a matrix of first diode steering cells arranged in a plurality of rows and a plurality of columns on a first layer of the memory array; and
a plurality of X lines, wherein the X lines are not substantially parallel to the rows;
wherein each of the first diode steering cells contacts at least one of the plurality of X lines, and a number of X lines of the plurality of the X lines is greater than a number of columns of the plurality of columns.

22. The memory array of claim 21 wherein the number of X lines is approximately two times the number of columns.

23. The memory array of claim 21, further comprising:
a plurality of Y lines, wherein the Y lines are not substantially parallel to the columns;
wherein each of the first diode steering cells contacts at least one of the plurality of Y lines, and a number of Y lines of the plurality of the Y lines is greater than a number of rows of the plurality of rows.

24. The memory array of claim 23 wherein the number of Y lines is approximately two times the number of rows.

25. The memory array of claim 24 wherein each of the first diode steering cells comprise:
a first diode; and
a resistivity switching storage element,
wherein the first diode electrically contacts the resistivity switching storage element and one X line, and the resistivity switching storage element also contacts one Y line.

26. The memory array of claim 25 wherein each diode electrically contacts at least three resistivity switching storage elements,
wherein each diode is part of at least three first diode steering cells.

27. The memory array of claim 26 further comprising:
a second diode,
wherein the second diode electrically contacts only one of the at least three resistivity switching storage elements, electrically contacts at least two additional resistivity switching storage elements, and electrically contacts only one Y line.

28. The memory array of claim 27 further comprising:
a matrix of second diode steering cells arranged in a second plurality of rows and a second plurality of columns on a second layer of the memory array; and
a second plurality of Y lines wherein the second Y lines are not substantially parallel to the columns;
wherein each of the second diode steering cells contacts at least one of the second plurality of Y lines, a second number of Y lines of the second plurality of the Y lines is greater than a second number of rows of the second plurality of rows, and the plurality of X lines is shared by the matrix of diode steering cells and matrix of second diode steering cells.

* * * * *